US011062754B2

(12) United States Patent
Ito et al.

(10) Patent No.: US 11,062,754 B2
(45) Date of Patent: *Jul. 13, 2021

(54) APPARATUS AND METHODS FOR REFRESHING MEMORY

(71) Applicant: Micron Technology, Inc., Boise, ID (US)

(72) Inventors: Yutaka Ito, Taito-ku (JP); Yuan He, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/869,359

(22) Filed: May 7, 2020

(65) Prior Publication Data

US 2020/0265888 A1  Aug. 20, 2020

Related U.S. Application Data

(63) Continuation of application No. 15/789,897, filed on Oct. 20, 2017, now Pat. No. 10,672,449.

(51) Int. Cl.
    *G06F 13/00* (2006.01)
    *G11C 11/406* (2006.01)
    (Continued)

(52) U.S. Cl.
    CPC ....... *G11C 11/40611* (2013.01); *G11C 11/403* (2013.01); *G11C 11/40618* (2013.01); *G11C 11/408* (2013.01)

(58) Field of Classification Search
    CPC ............. G11C 11/40611; G11C 11/403; G11C 11/40618; G11C 11/408
    See application file for complete search history.

(56) References Cited

U.S. PATENT DOCUMENTS

| 5,299,159 A | 3/1994 | Balistreri et al. |
|---|---|---|
| 5,943,283 A | 8/1999 | Wong et al. |

(Continued)

FOREIGN PATENT DOCUMENTS

| JP | 2005-216429 A | 8/2005 |
|---|---|---|
| JP | 2011-258259 A | 12/2011 |

(Continued)

OTHER PUBLICATIONS

International Search Report and Written Opinion dated Jan. 29, 2019 for PCT Application No. PCT/US2018/055821, 9 pages.

(Continued)

*Primary Examiner* — Uyen Smet
(74) *Attorney, Agent, or Firm* — Dorsey & Whitney LLP

(57) ABSTRACT

Apparatuses for executing interrupt refresh are described. An example apparatus includes: memory banks, a sampling timing generator circuit, bank sampling circuits and a command state signal generator circuit that provides a command state signal responsive to a command. Each memory bank includes a latch that stores an address for interrupt refresh. The sampling timing generator circuit receives an oscillation signal and provides a trigger signal of sampling the address. Each bank sampling circuit is associated with a corresponding memory bank. Each bank sampling circuit provides a sampling signal to the latch in the corresponding memory bank responsive to the trigger signal of sampling the address. The sampling timing generator circuit provides the trigger signal of sampling the address, responsive, at least in part, to the command state signal, and the latch stores the address, responsive, at least in part, to the at least one trigger signal of sampling the address.

20 Claims, 21 Drawing Sheets

(51) Int. Cl.
*G11C 11/403* (2006.01)
*G11C 11/408* (2006.01)

(56) References Cited

U.S. PATENT DOCUMENTS

| | | | |
|---|---|---|---|
| 6,977,824 B1 | 12/2005 | Yang et al. | |
| 7,061,225 B2 | 6/2006 | Yang et al. | |
| 7,061,780 B2 | 6/2006 | Yang et al. | |
| 7,830,742 B2 | 11/2010 | Han | |
| 8,625,360 B2 | 1/2014 | Iwamoto et al. | |
| 8,811,100 B2 | 8/2014 | Ku | |
| 9,032,141 B2 | 5/2015 | Bains et al. | |
| 9,117,544 B2 | 8/2015 | Bains et al. | |
| 9,478,316 B1 * | 10/2016 | Ryu | G11C 11/406 |
| 9,805,783 B2 | 10/2017 | Ito et al. | |
| 9,928,896 B1 * | 3/2018 | Kim | G06F 1/08 |
| 10,003,328 B1 | 6/2018 | Yin et al. | |
| 10,032,501 B2 | 7/2018 | Ito et al. | |
| 10,170,174 B1 | 1/2019 | Ito et al. | |
| 10,418,978 B1 | 9/2019 | Au Yeung et al. | |
| 2004/0130959 A1 | 7/2004 | Kawaguchi | |
| 2007/0058462 A1 | 3/2007 | Blodgett | |
| 2008/0181048 A1 | 7/2008 | Han | |
| 2010/0329069 A1 | 12/2010 | Ito et al. | |
| 2011/0299352 A1 | 12/2011 | Fujishiro et al. | |
| 2011/0310648 A1 | 12/2011 | Iwamoto et al. | |
| 2012/0155206 A1 | 6/2012 | Kodama et al. | |
| 2012/0327734 A1 | 12/2012 | Sato | |
| 2014/0006703 A1 | 1/2014 | Bains et al. | |
| 2014/0006704 A1 | 1/2014 | Greenfield et al. | |
| 2014/0095786 A1 | 4/2014 | Moon et al. | |
| 2014/0237307 A1 | 8/2014 | Kobla et al. | |
| 2014/0241099 A1 | 8/2014 | Seo et al. | |
| 2014/0281206 A1 | 9/2014 | Crawford et al. | |
| 2015/0089326 A1 | 3/2015 | Joo et al. | |
| 2015/0213872 A1 | 7/2015 | Mazumder et al. | |
| 2015/0255140 A1 | 9/2015 | Song | |
| 2015/0294711 A1 | 10/2015 | Gaither et al. | |
| 2015/0380073 A1 * | 12/2015 | Joo | G11C 11/406 365/189.05 |
| 2016/0078911 A1 | 3/2016 | Fujiwara et al. | |
| 2016/0086649 A1 | 3/2016 | Hong et al. | |
| 2016/0125931 A1 | 5/2016 | Doo et al. | |
| 2016/0196863 A1 | 7/2016 | Shin et al. | |
| 2016/0352518 A1 | 12/2016 | Ford et al. | |
| 2017/0263305 A1 | 9/2017 | Cho | |
| 2017/0287547 A1 | 10/2017 | Ito et al. | |
| 2018/0005690 A1 | 1/2018 | Morgan et al. | |
| 2018/0025770 A1 | 1/2018 | Ito et al. | |
| 2018/0158507 A1 * | 6/2018 | Bang | G11C 11/40611 |
| 2018/0182445 A1 | 6/2018 | Lee et al. | |
| 2018/0261268 A1 | 9/2018 | Hyun et al. | |
| 2018/0308539 A1 | 10/2018 | Ito et al. | |
| 2019/0122722 A1 | 4/2019 | Yamada et al. | |
| 2019/0122723 A1 | 4/2019 | Ito et al. | |
| 2019/0139599 A1 | 5/2019 | Ito et al. | |
| 2019/0237131 A1 | 8/2019 | Ito | |
| 2019/0371390 A1 | 12/2019 | Ito | |
| 2020/0211634 A1 * | 7/2020 | Ishikawa | G11C 11/4087 |

FOREIGN PATENT DOCUMENTS

| | | |
|---|---|---|
| JP | 2013-004158 A | 1/2013 |
| WO | 2017171927 A1 | 10/2017 |
| WO | 2019083884 A1 | 5/2019 |

OTHER PUBLICATIONS

U.S. Appl. No. 16/699,977, titled "Apparatuses and Methods for Access Based Random Sampling", filed Dec. 2, 2019.
U.S. Appl. No. 16/228,446, titled "Apparatuses and Methods for Variable Address Sample Timing", filed Dec. 20, 2018.
U.S. Appl. No. 16/228,484, titled "Apparatuses and Methods for Sample Signal Timing With Multiple Clocks", filed Dec. 20, 2018.
U.S. Appl. No. 16/452,196 titled "Apparatuses and Methods for Address Sampling Randomization" filed Jun. 25, 2019.
U.S. Appl. No. 16/816,017, titled "Apparatuses and Methods for Sample Signal Timing With Multiple Clocks", dated Mar. 11, 2020.
U.S. Appl. No. 16/386,775 titled "Apparatuses and Methods for Random Signal Generation" filed Apr. 17, 2019, pp. all.
Kim, et al., "Flipping Bits in MemoryWithout Accessing Them: An Experimental Study of DRAM Disturbance Errors", IEEE, Jun. 2014, 12 pgs.

* cited by examiner

APPARATUS AND METHODS FOR REFRESHING MEMORY

CROSS-REFERENCE TO RELATED APPLICATION

This application is a continuation of U.S. patent application Ser. No. 15/789,897, filed Oct. 20, 2017, issued as U.S. Pat. No. 10,672,449 on Jun. 2, 2020. This application and patent are incorporated by reference herein in their entirety and for all purposes.

BACKGROUND

High data reliability, high speed of memory access, and reduced chip size are features that are demanded from semiconductor memory.

A dynamic random access memory (DRAM), which is a typical semiconductor memory device, stores information by charges accumulated in cell capacitors, and, therefore, the information is lost unless refresh operations are periodically carried out.

The information may be further lost as bit errors due to Row Hammer effects and/or Ras-Clobber effects. In either case, such bit errors may take place on one or more memory cells each coupled to a non-selected word line that is adjacent to a selected word line subjected to Row Hammer (indicating that the selected word line is driven to an active level a great number of times successively) or Ras-Clobber (indicating that the selected word line is driven to the active level continuously for a considerably long period). The memory cells coupled to such non-selected word line are thus required to be refreshed prior to losing the information stored therein. On the other hand, auto-refresh (AREF) commands indicating refresh operations are periodically issued from a control device such as a memory controller, which controls a DRAM. The AREF commands are provided from the control device at a frequency that all the word lines are certainly refreshed once in the one refresh cycle (for example, 64 msec). However, refresh addresses according to the AREF commands are determined by a refresh counter provided in DRAM. For this reason, refresh operations responsive to the AREF commands may not prevent bit errors due to Row Hammer effects and/or Ras-Clobber effects. Thus, steal-refresh is carried out to perform Row Hammer refresh (RHR) operations in which some of refresh operations responsive to the AREF commands are stolen therefrom and then allocated to the RHR operations to refresh the memory cells coupled to the non-selected word line that is adjacent to the selected word line subjected to Row Hammer and/or Ras-Clobber.

One way to dynamically control the steal-refresh is time-based random sampling of a row address by randomizing timings for sampling. Because sampling timings (activations of an ArmSample signal) are determined by an internal oscillator providing an oscillation signal (SrefOsc), the time-based random sampling may have empty-hits when there is no memory access due to absence of active commands with row addresses for reading or writing data.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
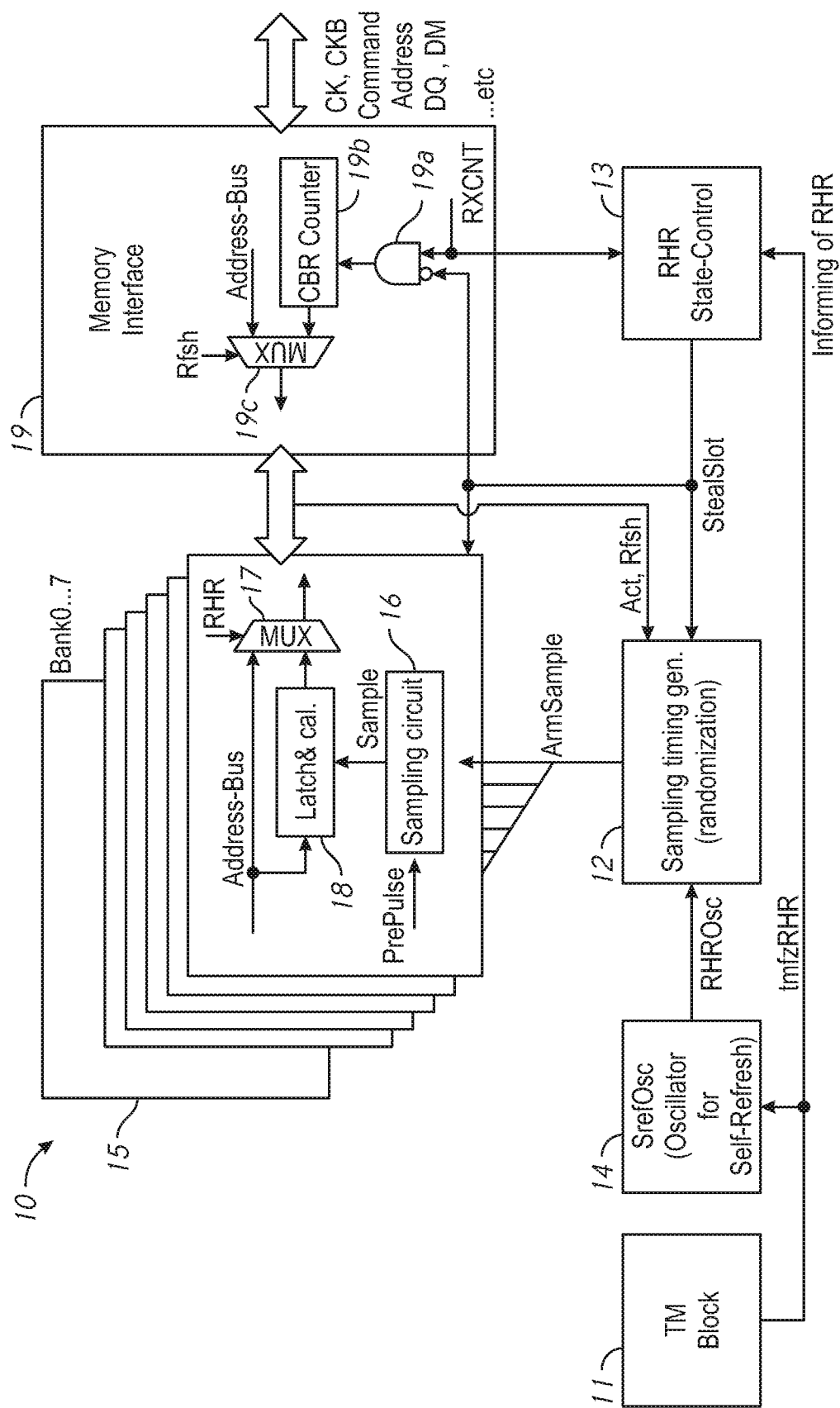
FIG. 1A is a block diagram of a semiconductor device including a plurality of memory banks, a sampling timing generator circuit and a plurality of sampling circuits associated with the plurality of corresponding memory banks, in accordance with an embodiment of the present disclosure.

FIG. 1A is a block diagram of a semiconductor device 10 including a plurality of memory banks 15 and a sampling timing generator circuit 12, a plurality of sampling circuits 16 associated with the plurality of corresponding memory banks 15, in accordance with an embodiment of the present disclosure. The semiconductor device 10 may be an LPDDR4 SDRAM integrated into a single semiconductor chip, for example. The semiconductor device 10 may include the plurality of memory banks 15, a memory interface circuit 19 (e.g., DRAM interface), a row hammer refresh (RHR) state control circuit 13, the sampling timing generator circuit 12, a self-refresh oscillator (SrefOsc) 14 and a test mode (TM) block 11. For example, the memory interface circuit 19 may be a DRAM interface that may receive and transmit clock signals, command signals, address signals and data signals, etc.

For example, the TM block 11 may provide a steal rate control signal tmfzRHR in order to adjust a steal rate that is a rate at which RHR enters in a test mode. The self-refresh oscillator 14 may control a frequency (cycle) of a frequency-divided RHR oscillation signal (RHROsc), responsive, at least in part, to the steal rate control signal tmfzRHR, The RHROsc signal may be used as a clock signal for signaling an internal cycle. The row hammer refresh (RHR) state control circuit 13 may provide an instruction signal StealSlot that is an instruction signal for executing steal-refresh (or RHR) operations instead of normal refresh based on each auto-refresh (AREF) command. For example, the RHR state-control circuit 13 may receive the steal rate control signal tmfzRHR and an RXCNT signal that is a clock signal obtained from an auto-refresh (AREF) command to a refresh counter (CBR counter) 19b in the memory interface circuit 19, the RHR state-control circuit 13 and the like, and may provide an instruction signal StealSlot for executing steal-refresh (or RHR) instead of normal refresh.

For example, the sampling timing generator circuit 12 may be provided in common for the plurality of memory banks 15 in FIG. 1A. The sampling timing generator circuit 12 may receive the instruction signal StealSlot from the RHR state-control circuit 13 and may further receive the frequency-divided RHR oscillation signal (RFIROsc) from the self-refresh oscillator 14 for self-refresh. The sampling timing generator circuit 12 may provide a trigger signal for sampling (ArmSample) to each sampling circuit 16 of each memory bank of the plurality of memory banks 15 (e.g., Bank0, . . . Bank 7) at a random timing. The ArmSample signal may be randomized by randomization of a frequency of the activation of the ArmSample signal and a difference between an interval of RHR execution (e.g., each time auto-refresh command is provided) and an interval (e.g., a cycle) of the frequency-divided RHR oscillation signal (RhrOsc).

The sampling circuit 16 may provide a sampling signal (Sample) responsive to the ArmSample signal and further to a next PrePulse signal that is generated upon a receipt of a precharge command. A latch and calculator 18 (e.g., a latch, a flip-flop, etc.) of each memory bank of the plurality of memory banks 15 (e.g., Bank0, . . . Bank7) may capture (e.g., latch) a row (X) address on an address bus responsive to the sampling signal (Sample). The row address on the address bus is to access a memory array (not shown) provided in each memory bank of the plurality of memory banks 15 (e.g., Bank0, . . . Bank7). The latch and calculator 18 further may calculate an adjacent address of the latched row address and may provide the adjacent address as an RHR refresh address. A multiplexer MUX 17 may be a switch that may work as a refresh circuit configured to perform a steal-refresh operation to refresh a memory cell designated by the RHR refresh address. The multiplexer MUX 17 may receive the adjacent address from the latch and calculator 18 and the row address from the address bus, and provide either one of the adjacent address and the row address, responsive to an RHR signal that is generated from an Rfsh signal. The Rfsh signal may be generated while receiving the auto-refresh (AREF) command. In the RHR operation, the multiplexer MUX 17 may provide the adjacent address responsive to the RHR signal in an active state. The multiplexer MUX 17 may provide the row address responsive to the RHR signal in an inactive state. Thus, either the row address or the adjacent address most recently captured becomes a valid address that is provided to the memory array in the corresponding memory bank. The row address to the multiplexer MUX 17 may be provided by a multiplexer MUX 19c of the interface circuit 19. The multiplexer MUX 19c may receive an access row address associated with an active command for data reading or writing supplied to the memory interface 19 through an address bus. The multiplexer MUX 19c may further receive a refresh address from a refresh counter (CBR counter) 19b. The CBR counter 19b may receive a logic AND signal of the RXCNT signal and an inverted signal of the instruction signal for RHR execution StealSlot via a logic AND circuit 19a. The refresh counter (CBR counter) 19b may be stopped when the RHR state-control circuit 13 provides the instruction signal for RHR execution StealSlot substantially simultaneously as the RHR signal is generated from the Rfsh signal. The multiplexer MUX 19c may provide the refresh address from the refresh counter (CBR counter) 19b responsive to auto-refresh (APER) command (the Rfsh signal in an active state). The multiplexer MUX 19c may further provide the row (X) address responsive to a read or write command. Thus, the multiplexer MUX 19c may provide either the refresh address or the row (X) address to the address bus of each memory bank coupled to the multiplexer MUX 17.

Figure 1B:
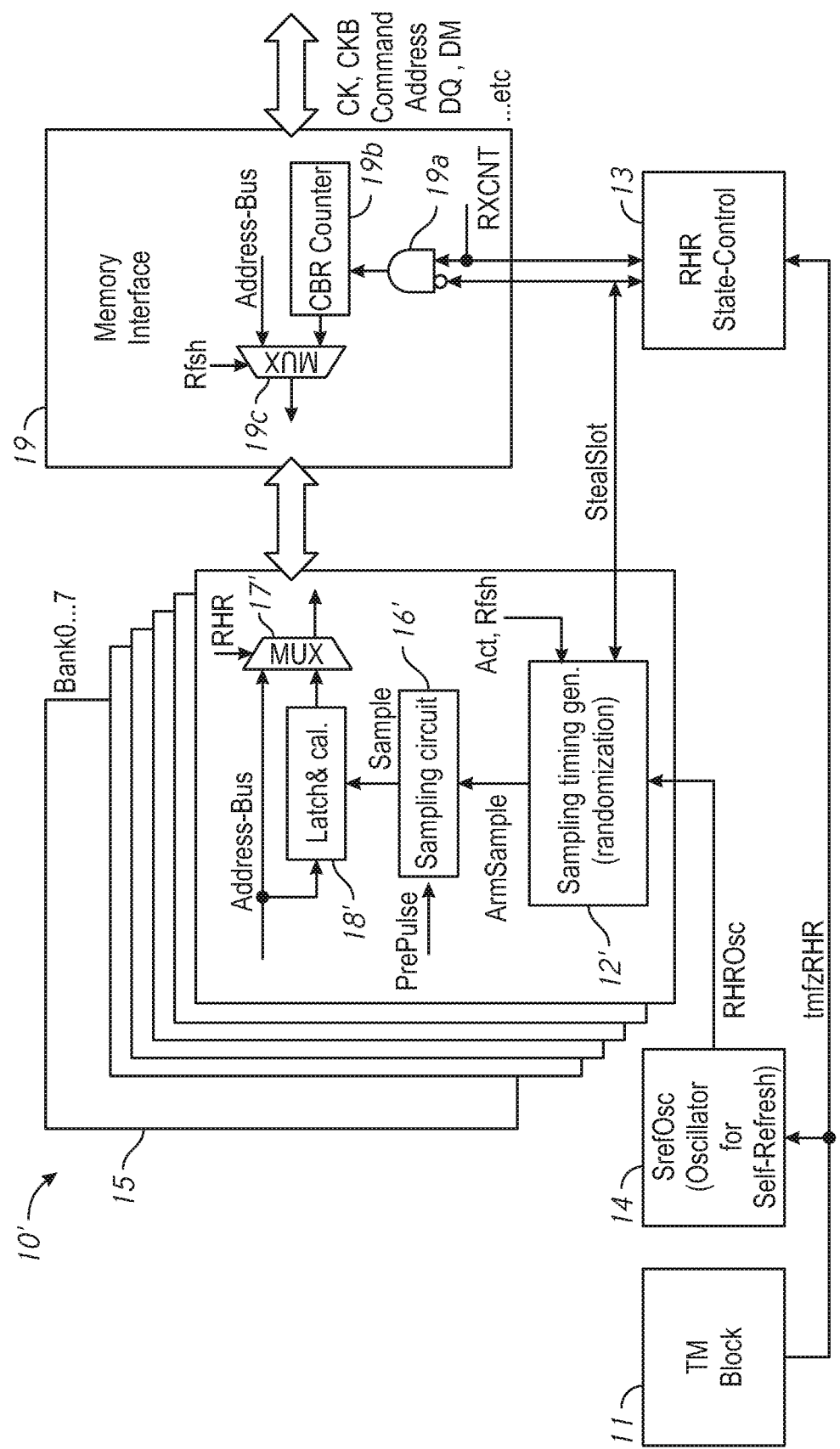
FIG. 1B is a block diagram of a semiconductor device including a plurality of memory banks, a plurality of sampling timing generator circuits and a plurality of sampling circuits associated with the plurality of corresponding memory banks, in accordance with an embodiment of the present disclosure.

FIG. 1B is a block diagram of a semiconductor device 10' including a plurality of memory banks 15', a plurality of sampling timing generator circuits 12' and a plurality of sampling circuits 16' associated with the plurality of corresponding memory banks 15' (e.g., Bank0, . . . Bank7), in accordance with an embodiment of the present disclosure. Description of components corresponding to components included in FIG. 1A will not be repeated and changes from FIG. 1B including a plurality of sampling timing generator circuits 12' will be described. For example, each sampling timing generator circuit 12' of the plurality of sampling timing generator circuits 12' may be provided for a corresponding memory bank 15' of the plurality of memory banks 15' for a per-bank-refresh specification. Responsive to the ArmSample signal from each sampling timing generator circuit 12', the sampling circuit 16' associated with the sampling timing generator circuit 12' may provide a sampling signal (Sample) responsive to a next PrePulse signal that is generated upon a receipt of a precharge command. Additionally, the multiplexer MUX 19c in the memory interface circuit 19 may be coupled to an address bus of each memory bank of the plurality of banks 15' (e.g., Bank0, . . . Bank7).

Figure 2A:
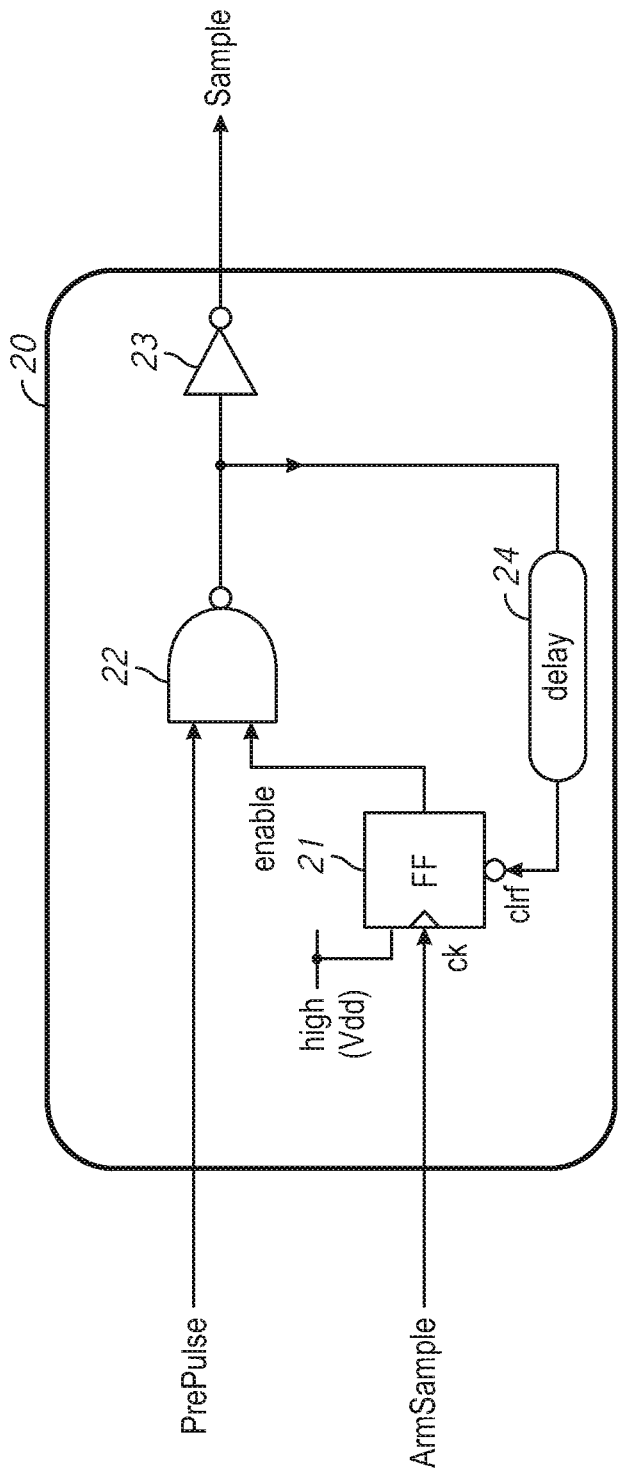
FIG. 2A is a circuit diagram a sampling circuit in accordance with an embodiment of the present disclosure.

FIG. 2A is a circuit diagram a sampling circuit 20 in accordance with an embodiment of the present disclosure. For example, the sampling circuit 20 may be the sampling circuit 16 in FIG. 1A or 16' in FIG. 1B. For example, the sampling circuit 20 may include a latch circuit 21 and a NAND circuit 22. For example, the latch circuit 21 may be a flip-flop that may receive the trigger signal for sampling (ArmSample) from the sampling timing generator circuit 12 at a clock input and a positive power potential (Vdd, a logic high level) at a data input and provide a latched ArmSample signal as an enable signal to the NAND circuit 22. The NAND circuit 22 may receive a PrePulse signal that may be active for one bank among a plurality of banks. The NAND circuit 22 may provide the latched ArmSample signal after inversion at an inverter 23 as a sampling signal (Sample), if the bank related to the received PrePulse signal is active. The latch circuit 21 may be reset by an inversion of the output signal of the NAND circuit 22 with a delay from a delay circuit 24.

Figure 2B:
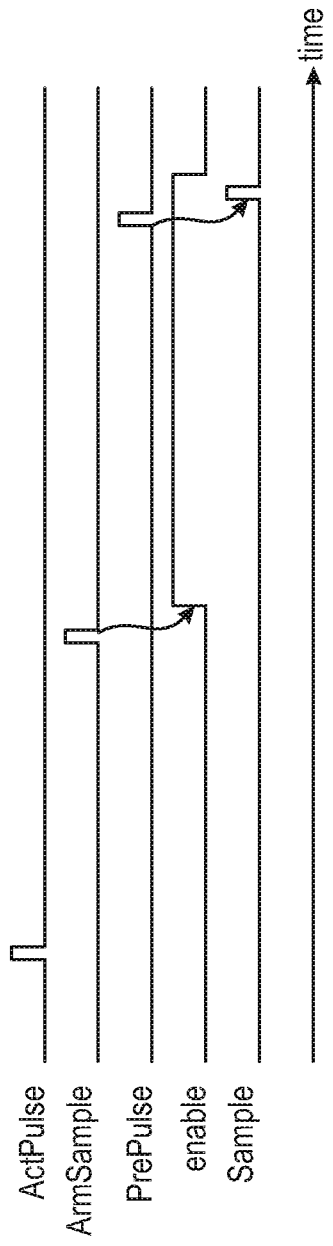
FIG. 2B is a timing diagram of signals in the sampling circuit of FIG. 2A in accordance with the embodiment of the present disclosure.

FIG. 2B is a timing diagram of signals in the sampling circuit of FIG. 2A in accordance with the embodiment of the present disclosure. Responsive to a pulse of an ActPulse signal, a pulse on the ArmSample signal is provided. The latch circuit 21 may provide an enable signal in an active state responsive to the pulse of the ArmSample signal. While the enable signal is in the active state, the NAND circuit 22 may provide a pulse on the Sample: signal responsive to a pulse of the PrePulse signal.

Figure 3:
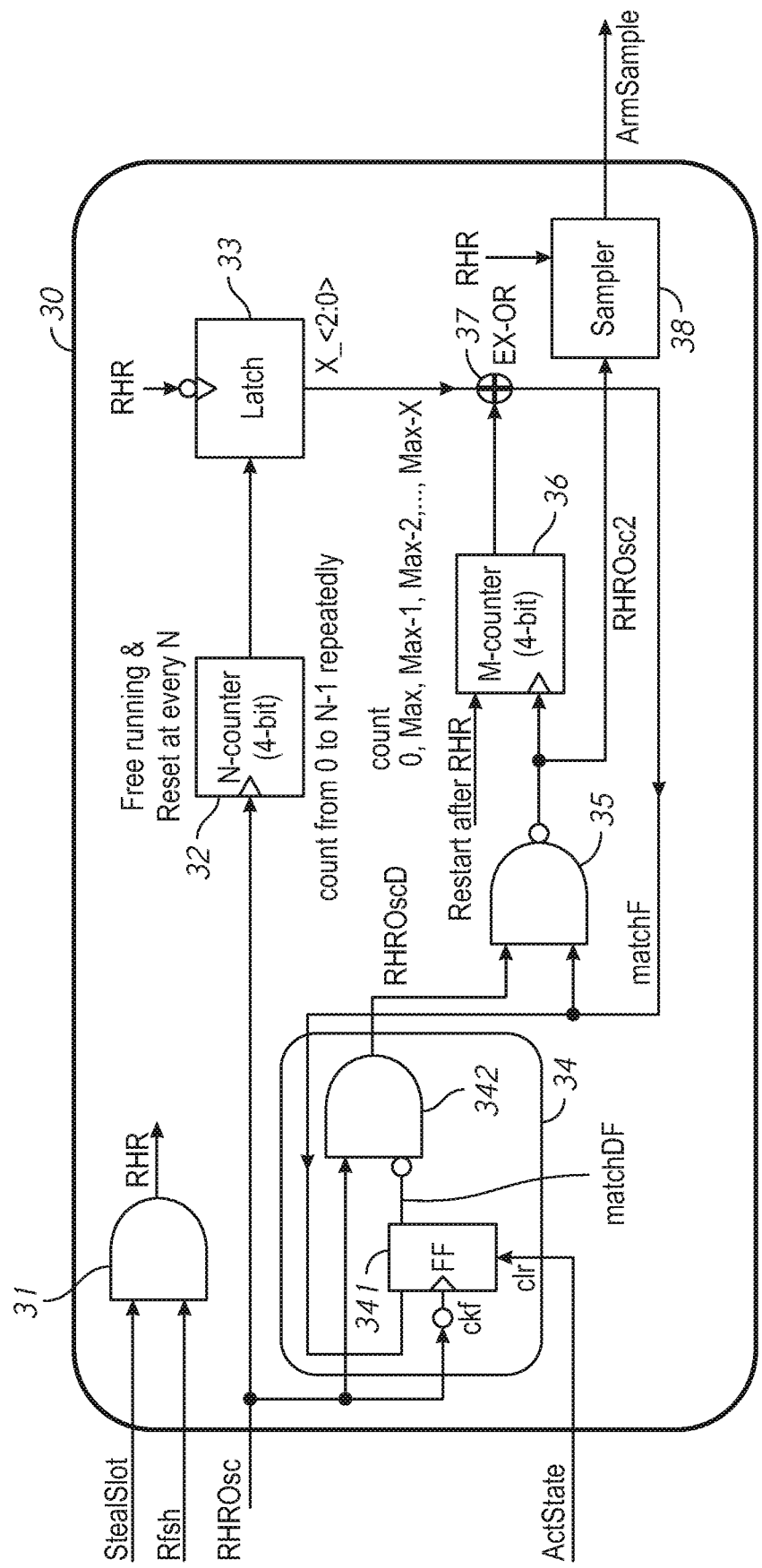
FIG. 3 is a circuit diagram of a sampling timing generator circuit in accordance with an embodiment of the present disclosure.

FIG. 3 is a circuit diagram of a sampling timing generator circuit 30 in accordance with an embodiment of the present disclosure. For example, the sampling timing generator circuit 30 may be used as the sampling timing generator circuit 12 or 12'. The sampling timing generator circuit 30 may include an N-counter 32, an M-counter 36 and a sampler circuit 38. For example, the N-counter 32 may be a free-running counter circuit that receives a frequency-divided RHR oscillation signal (REROsc) as a clock signal and may continuously count an integer from 0 to (N−1) in an incremental manner up to the integer N, such as 0, 1, 2 . . . , N−1, responsive to the frequency-divided RHR oscillation signal (RHROsc), and the N-counter 32 may provide a count signal. The N-counter 32 may be reset when the integer matches the integer N. The RHR signal may be provided to a latch circuit 33. The latch circuit 33 may latch the count signal responsive to the RHR signal in an active state and may further provide an inversion of the latched count signal as a latched signal X_<2:0> (e.g., indicative of "3") to a comparator 37 that may be a logic exclusive-OR circuit. Timings of the RHR signal may be randomized, thus the timing when the count of the N-counter 32 that is latched responsive to the RHR signal may be irregular and not periodical, and the count may be randomized.

The M-counter 36 may receive an intermediate frequency-divided RHR oscillation signal (RHROsc2) as a clock signal. The M-counter 36 may continuously count an integer from a maximum number (Max) to a value which is a difference (Max-X) in a decremental manner and may provide the count to the comparator 37. For example, the M-counter 36 may reset the count to zero and to the maximum number, responsive to the RHR signal. When the RHR signal is activated, the count value is reset to 0, and since X_<2:0> (e.g., an inversion of the count of the N-Counter 32) is basically not zero, the comparator 37 may provide a matchF signal that is in an active state (e.g., a logic high level). Thus, a logic circuit 35 (e.g., a NAND circuit) may provide the intermediate frequency-divided RHR oscillation signal (RHROsc2) responsive to a post frequency-divided RHR oscillation signal (RHROscD), which will be explained later, while the matchF signal is in the active state and the count of the M-counter 37 is decreased from Max (e.g., 7 in a 3-bit counter) to (Max-X). When the count becomes (Max-X), the count becomes coincident with X_<2:0> (the inversion of X), and the comparator 37 may provide the matchF signal that is in an inactive state (e.g., a logic low level), the logic circuit 35 may provide a constant value (e.g., a logic high level) and the M-Counter 36 may stop counting.

The sampler circuit 38 may receive the intermediate frequency-divided RHR oscillation signal (RhrOsc2) and may provide a one-shot pulse signal as a trigger signal for sampling (ArmSample) responsive to the RHR signal. The timings of the RHR signal is randomized, thus a random number (X+1) of one-shot pulses may be provided on the ArmSample signal. For example, N of the N-counter 32 may be set to 8 or 9 when a steal rate (RHR interval) is set to 1/8 (RHR is executed every eight refresh operations).

The sampling timing generator circuit 30 may include an oscillator signal pre-process circuit 34. For example, the oscillator signal pre-process circuit 34 may include a latch (e.g., Flip-Flop) 341 and a logic circuit (e.g., an AND circuit) 342. The latch 341 may receive a command state signal ActState, the frequency-divided RHR oscillation signal RHROsc signal and the matchF signal and may provide a matchDF signal. The logic circuit 342 may receive an inversion of the matchDF signal and the frequency-divided RHR oscillation signal RHROsc and provide the post frequency-divided RHR oscillation signal RHROscD. As described later in FIGS. 4A and 4B, the ActState signal may be indicative of an active state and an inactive state responsive to an active (ACT) command and a precharge (PRE) command, respectively. For example, the precharge command may be associated with the active command preceding the precharge command. The ActState signal may be used to distinguish whether the current state is a precharge standby based on the precharge command or an active standby based on the active command, after a long period from a command entry. For example, a counting operation of the M-counter 36 may be stopped while the ActState signal is in the inactive state responsive to the precharge command for a long time. On the other hand, as long as the ActState signal is indicative of the active state, the M-counter 37 may count down, regardless of whether an ActPulse signal being continuously, transmitting pulses or the ActState signal being in the active state for a long period of time.

Figure 4A:
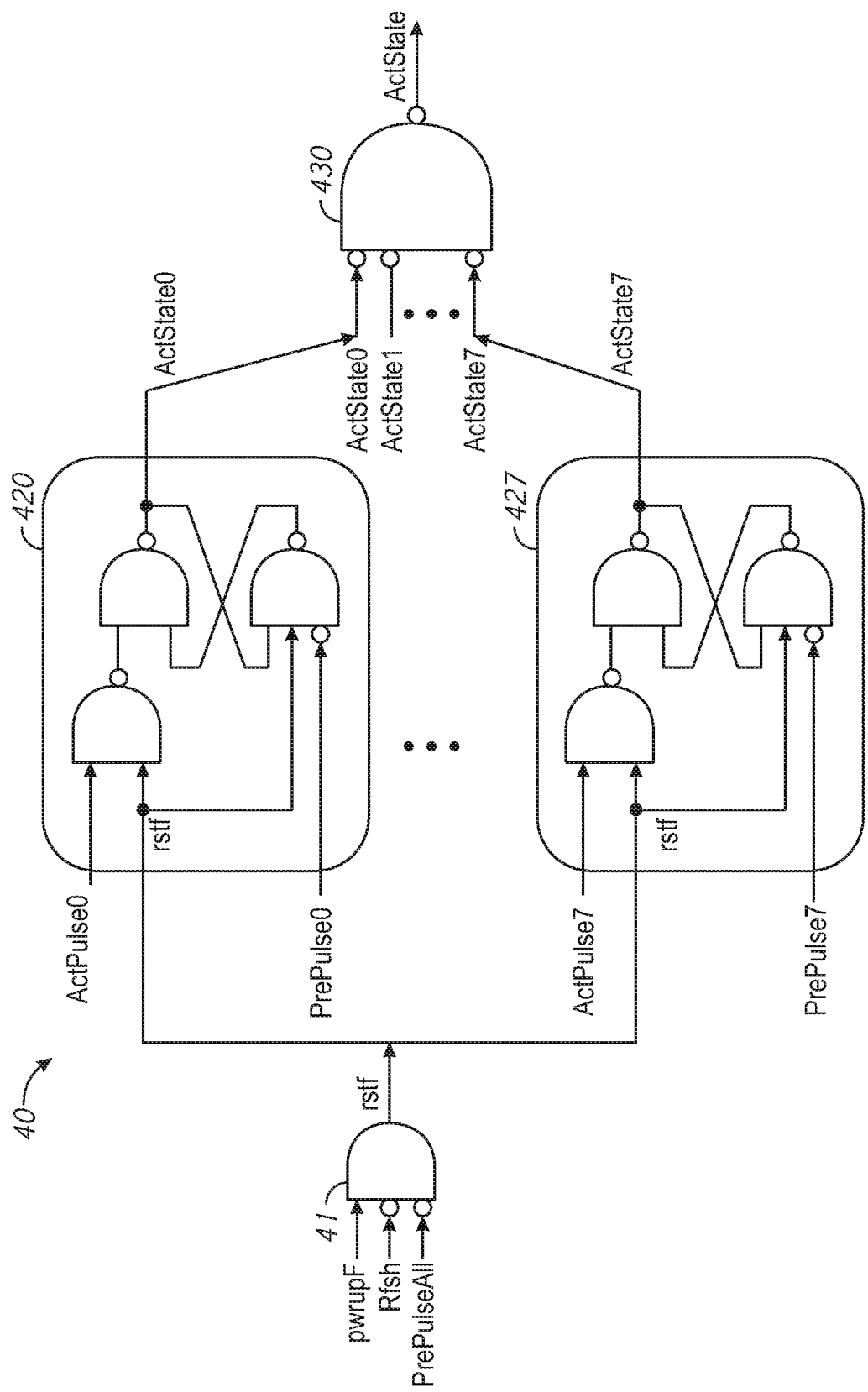
FIG. 4A is a circuit diagram of a command state signal generator circuit in accordance with an embodiment of the present disclosure.
Figure 4B:
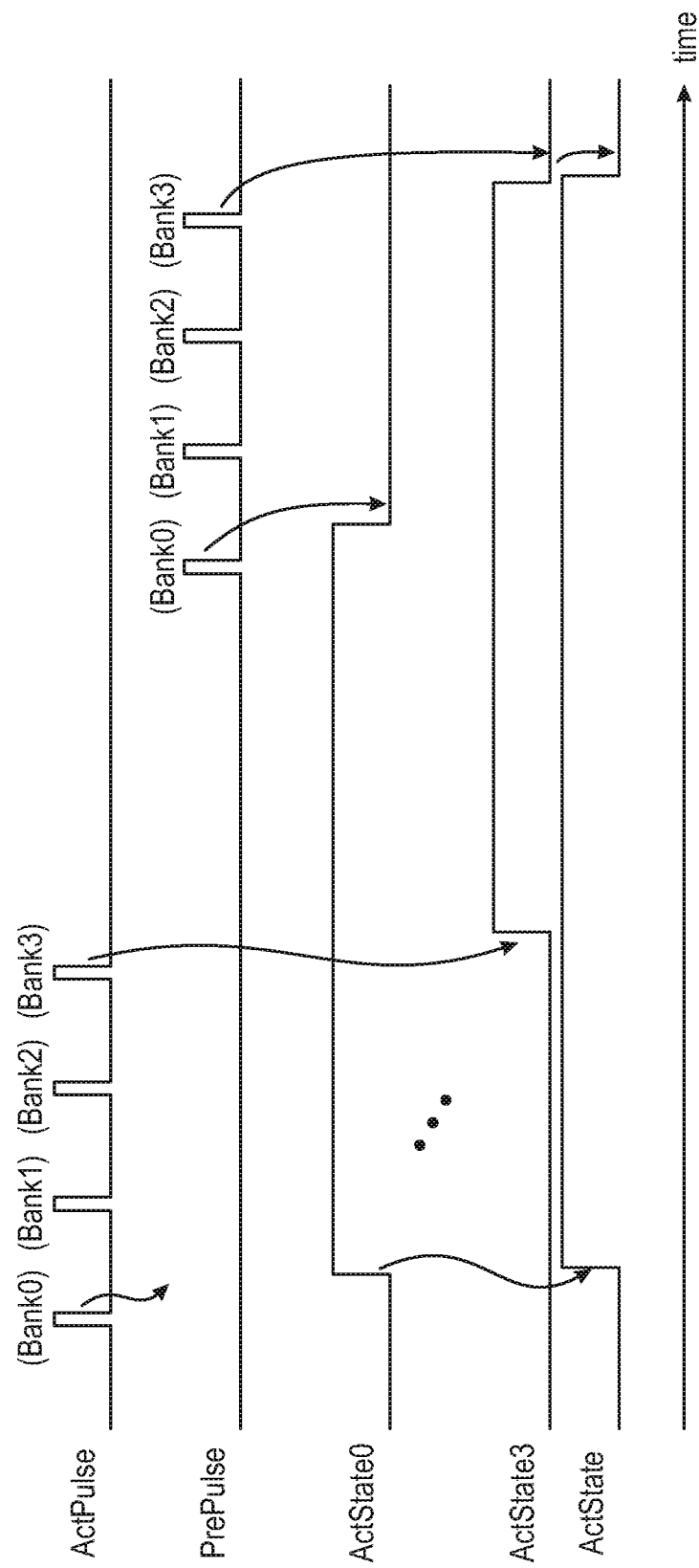
FIG. 4B is a timing diagram of signals in the command state signal generator circuit of FIG. 4A in accordance with the embodiment of the present disclosure.

FIG. 4A is a circuit diagram of a command state signal generator circuit 40 in accordance with an embodiment of the present disclosure. FIG. 4B is a timing diagram of signals in the command state signal generator circuit 40 of FIG. 4A in accordance with the embodiment of the present disclosure. In this example, the command state signal generator circuit 40 of FIG. 4A may be located in the memory interface 19 of FIG. 1A, or either in the memory interface 19 or in each memory bank 15 of FIG. 1B. The memory interface 19 may include a command decoder (not shown) which provides command based signals including ActPulse, PrePulse, etc., responsive to corresponding command signals including an active command, a precharge command, etc., that are provided to each memory bank 15 indicated by an address signal in the command signal. The command state signal generator circuit 40 may include an AND circuit 41 that may receive a reset signal at power-on (pwrupF), an inversion of the Rfsh signal that may be generated while receiving the auto-refresh (AREF) command, and an inversion of PrePulseAll signal that may indicate pulses responsive to precharge commands to any of the plurality of memory banks (e.g., Bank0 to Bank7) and may provide an rstf signal. The command state signal generator 40 may include a plurality of actstate generator circuits 420 to 427 that corresponds with a plurality of memory banks Bank0 to Bank7. For example, the actstate generator circuit 420 may include a NAND circuit and a flip-flop circuit. The actstate generator circuit 420 may receive ActPulse0 signal and the rstf signal at the NAND circuit. The flip-flop circuit may receive a PrePulse0 signal, the rstf signal and an output signal of the NAND circuit. The flip-flop circuit may provide an ActState0 signal that is in an active state responsive the ActPulse0 signal. For example, the ActPulse0 signal may transmit a one-shot pulse responsive to an active (ACT) command for Bank0 of the plurality of the memory banks. The flip-flop circuit may provide the ActState0 signal in an inactive state responsive to the PrePulse0 signal. For example, the PrePulse0 signal may transmit a one-shot pulse signal responsive to a precharge (PRE) command for Bank0 of the plurality of the memory banks. The actstate generator circuit 420 may provide an output signal of the flip-flop circuit as the ActState0 signal, which may be activated by any pulse of the ActPulse0 signal and may be deactivated by any pulse of the PrePulse0 signal. Similarly, the actstate generator circuit 421 to 427 may provide ActState1 to ActState7 signals responsive to a combination of ActPulse1-7 signals and PrePulse1-7 signals, respectively. The command state signal generator circuit 40 may further include an active state merge circuit 430. The active state merge circuit 430 may be a NAND circuit that may receive inversions of the ActState0-7 signals and may provide the ActState signal. For example, as shown in FIG. 4B, the command state signal generator circuit 40 may receive active (ACT) commands to Bank0 to Bank3, followed by precharge commands to Bank0 to Bank3 at later timings. The ActState0 signal may be activated responsive to the ActPulse signal for Bank0 and may be deactivated responsive to the PrePulse signal for Bank0.

Figure 5A:
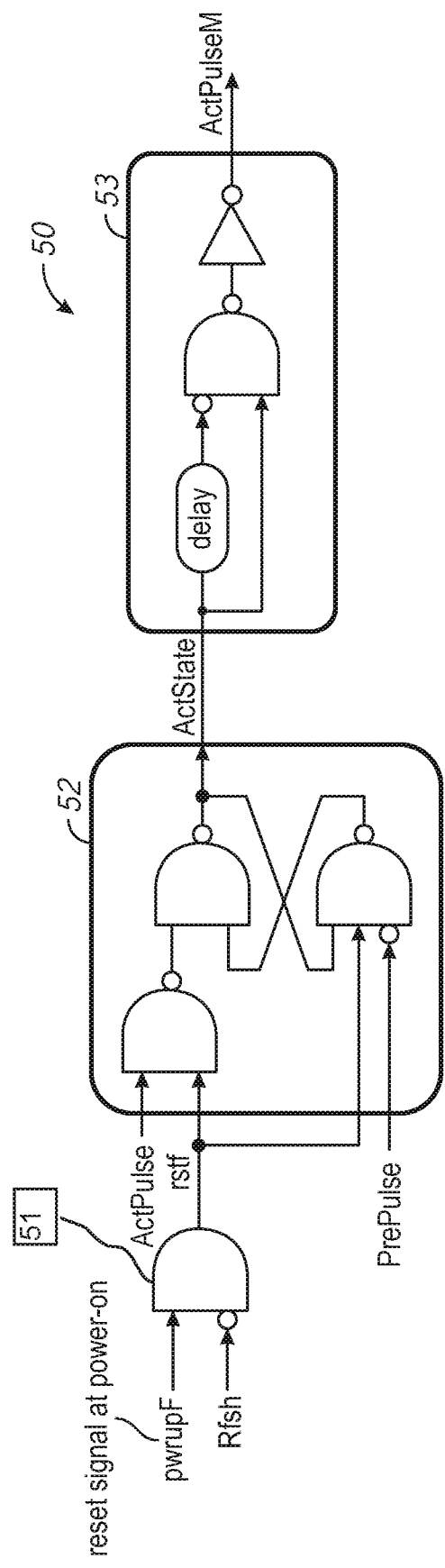
FIG. 5A is a circuit diagram of a command state signal generator circuit in the sampling timing generator circuit of FIG. 1B in accordance with an embodiment of the present disclosure.
Figure 5B:
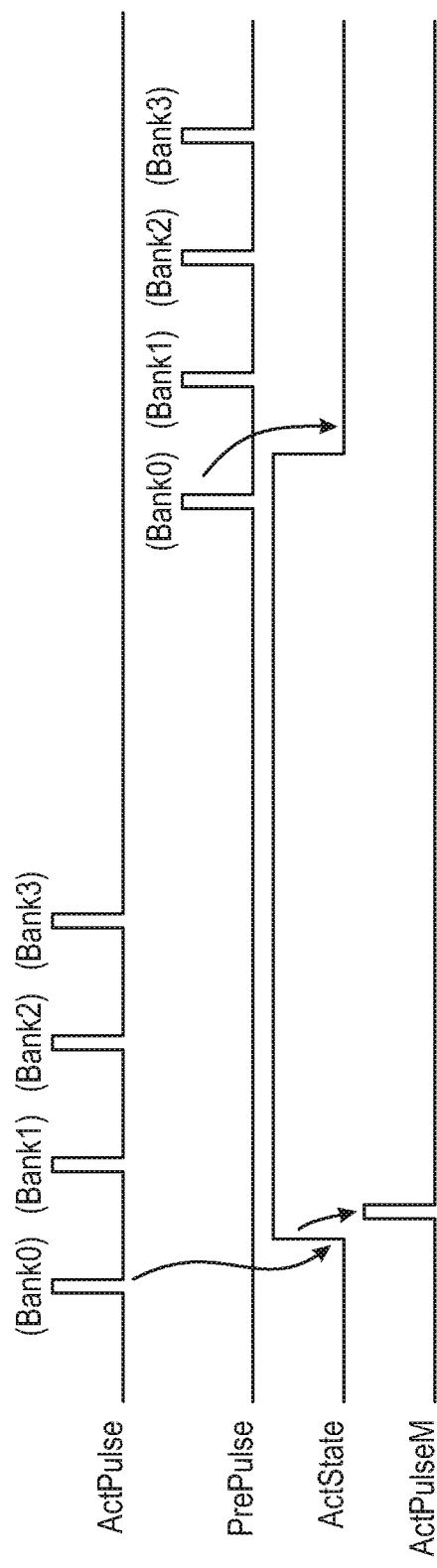
FIG. 5B is a timing diagram of signals in the command state signal generator circuit of FIG. 5A in accordance with the embodiment of the present disclosure.

FIG. 5A is a circuit diagram of a command state signal generator circuit 50 in the sampling timing generator circuit of FIG. 1B in accordance with an embodiment of the present disclosure. FIG. 5B is a timing diagram of signals in the command state signal generator circuit 50 of FIG. 5A in accordance with the embodiment of the present disclosure. For example, the command state signal generator circuit 50 may include an AND circuit 51 that may receive a reset signal at power-on (pwrupF) and an inversion of the Rfsh signal that may be generated while receiving the auto-refresh (AREF) command and may provide an rstf signal. The command state signal generator 50 may include an actstate generator circuit 52. For example, the actstate generator circuit 52 may include a NAND circuit and a flip-flop circuit. The actstate generator circuit 52 may receive the ActPulse signal and the rstf signal at the NAND circuit. The flip-flop circuit may receive the PrePulse signal, the rstf signal and an output signal of the NAND circuit. The flip-flop circuit may provide an ActState signal that is in an active state responsive the ActPulse signal. For example, the ActPulse signal may transmit a one-shot pulse signal responsive to an active (ACT) command for any memory bank of the plurality of the memory banks. The flip-flop circuit may provide the ActState signal in an inactive state responsive to the PrePulse signal. For example, the PrePulse signal may transmit a one-shot pulse signal responsive to a precharge (PRE) command for any memory bank of the plurality of the memory banks. Thus, the actstate generator circuit 52 may provide an output signal of the flip-flop circuit as the ActState signal, which may be activated by any pulse of the ActPulse signal and may be deactivated by any pulse of the PrePulse signal. The command state signal generator circuit 50 may further include an actpulse merge circuit 53. The actpulse merge circuit may include a NAND circuit that may receive the ActState signal and the ActState signal with a delay, and may provide a one-shot pulse signal ActPulseM responsive to an activation of the ActState signal.

Figure 6A:
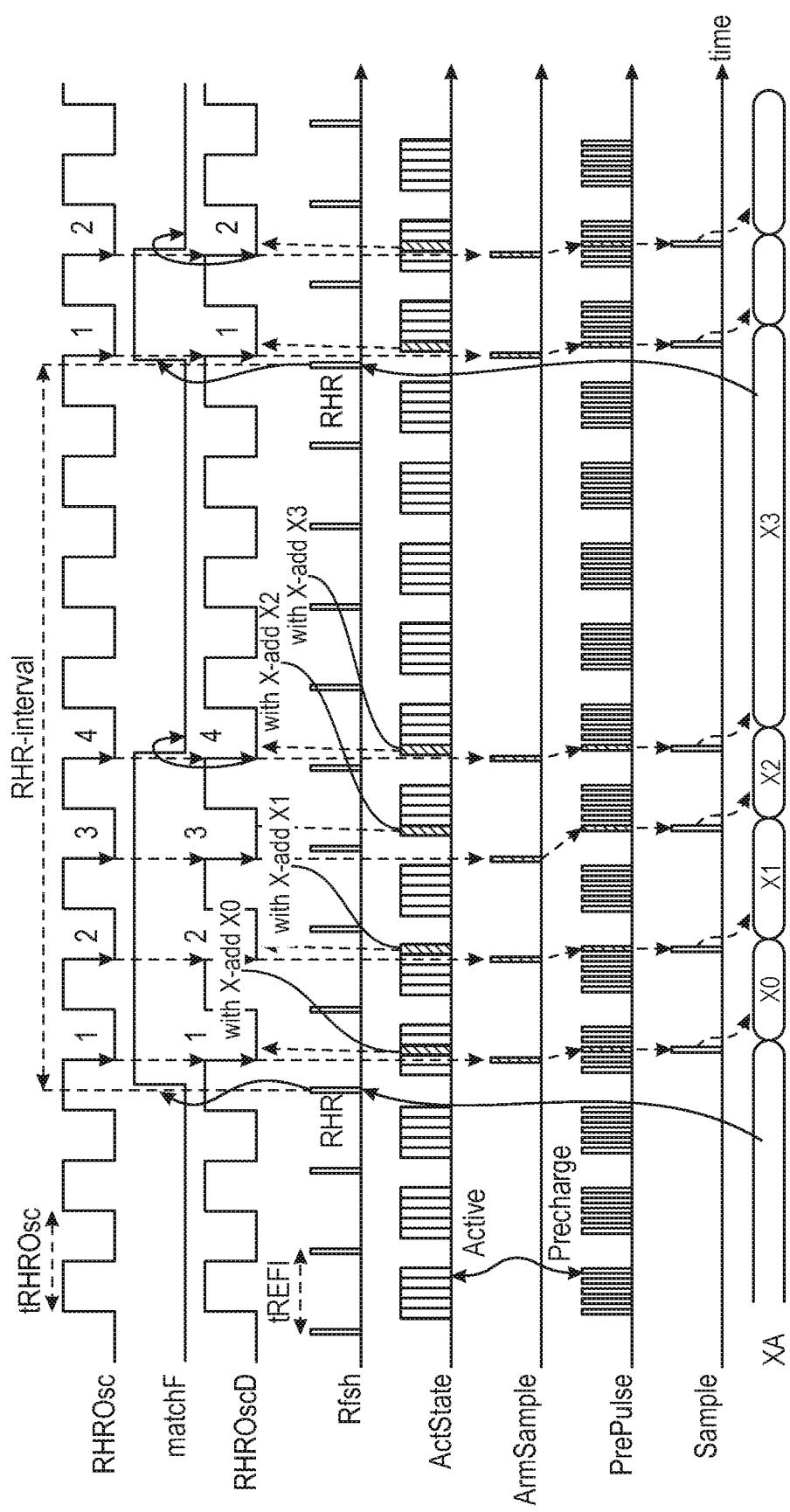
FIG. 6A is a timing diagram of signals in the sampling timing generator circuit of FIG. 3 receiving continuous active commands in accordance with an embodiment of the present disclosure.

FIG. 6A is a timing diagram of signals in the sampling timing generator circuit of FIG. 3 receiving continuous active commands in accordance with an embodiment of the present disclosure. For example, the sampling timing generator circuit 30 may include an AND circuit 31 that may provide the RHR signal based on the Rfsh signal for signaling refresh operations and the instruction signal StealSlot. For example, the one-shot RIM signal may be provided every eight pulses of the Rfsh signal when a steal rate (RHR interval) is set to 1/8 (RHR is executed every eight refresh operations) as indicated by the StealSlot signal. Responsive the RHR signal, the M-counter 36 may start counting as well as the count of the N-counter 33 captured by the latch 33 just before the RHR signal becoming active may be provided to the comparator 37, and the comparator 37 may provide the matchF signal in the active state until the X_<2:0> and the count of the M-counter 36 matches and an inversion of the intermediate frequency-divided RHR oscillation signal (RHROsc2) may be provided to the sampler 38. The sampler 38 may sample the intermediate frequency-divided RHR oscillation signal (RHOsc2) responsive to the RHR signal and may continuously provide active pulses on the ArmSample signal while the matchF signal is in the active state, receiving updated row addresses X0, X1, X2 and X3. While a memory cell represented by the row address X3 is repeatedly accessed, the matchF signal may be in the inactive state and no pulse is provided on the ArmSample signal. Here, the ActState signal, which is provided to a clr node of the latch (flip-flop) 341, may be predominantly active receiving continuous active commands. Thus the matchDF signal maybe mostly at an inactive level (e.g., a logic low level) and the logic circuit 342 may continuously provide the frequency-divided RHR oscillation signal RHROsc as the post frequency-divided RHR oscillation signal RHROscD to the logic circuit 35. While the matchF signal is active, the logic circuit 35 may provide an inversion of the post frequency-divided RHR oscillation signal RHROscD as the intermediate frequency-divided RHR oscillation signal RhrOsc2 to the sampler 38. Based on the intermediate frequency-divided RHR oscillation signal RhrOsc2, the sampler circuit 38 may provide one or more pulses on the ArmSample signal responsive to the RHR signal while the matchF signal is in the active state. Based on the ArmSample signal, the sampling circuit (e.g., 16, 16') may provide the sampling signal (Sample) responsive to the PrePulse signal.

Figure 6B:
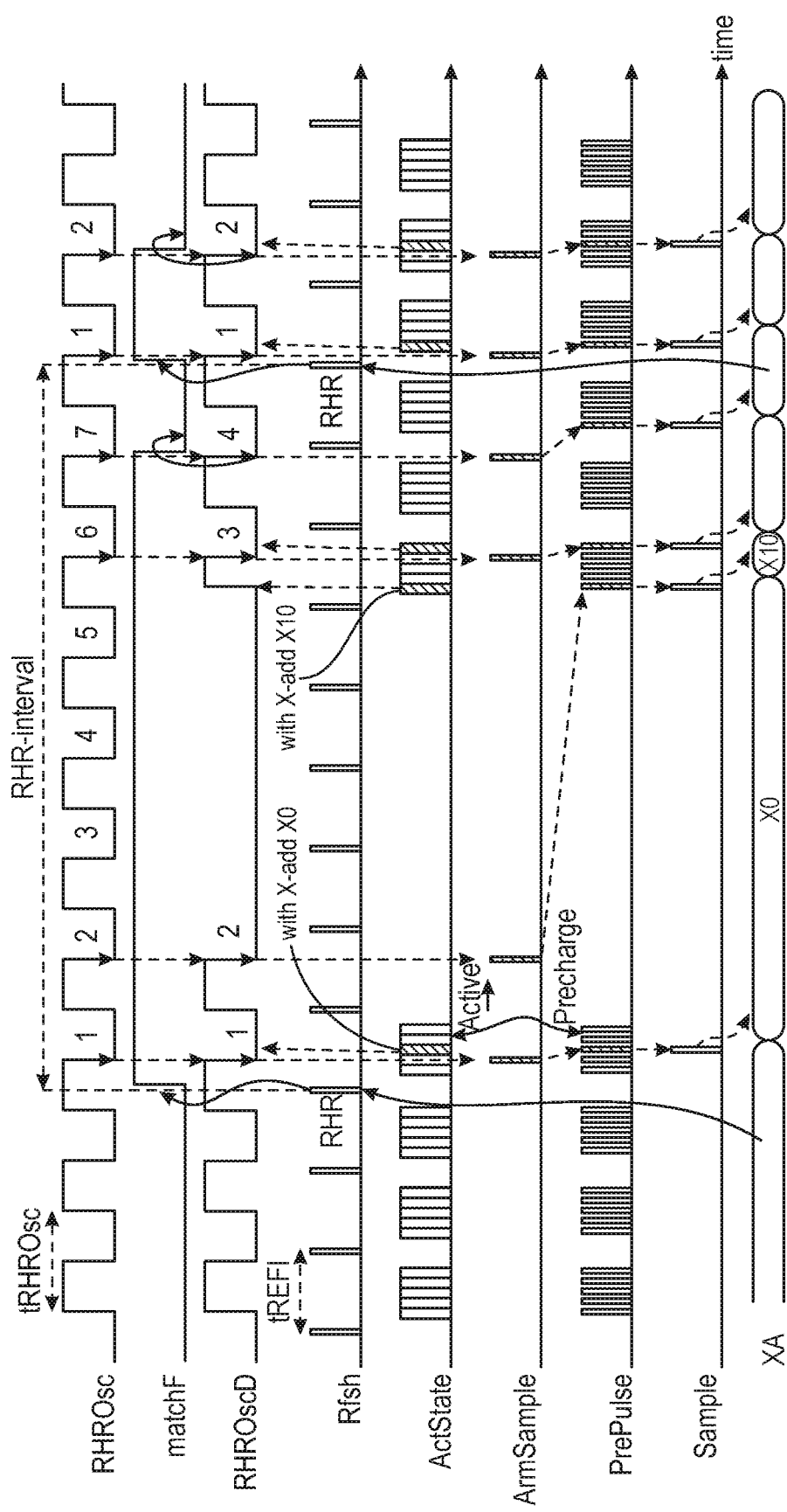
FIG. 6B is a timing diagram of signals in the sampling timing generator circuit of FIG. 3 receiving a precharge command with a long standby in accordance with an embodiment of the present disclosure.

FIG. 6B is a timing diagram of signals in the sampling timing generator circuit of FIG. 3 receiving a precharge command with a long standby in accordance with an embodiment of the present disclosure. Unlike receiving the continuous active commands, the ActState signal becomes inactive (e.g., a logic low level) responsive to the precharge command with the long standby. The latch 341 may continuously receive the inactive state of the ActState signal at the clock node, and provide the matchDF signal at an active level (e.g., a logic high level) that sets the post frequency-divided RHR oscillation signal RHROscD to a logic low level. Thus, the output signal of the logic circuit 35 is at a logic high level constantly and the M-counter 36 stops counting, and the intermediate frequency-divided RHR oscillation signal RhrOsc2 may not be provided to the sampler 38. Thus, the sampler 38 may not provide any pulses on the ArmSample signal in the long standby. After the long standby, the ActState signal that may be in the active state again may be provided to the clr node of the latch 341 and the oscillator signal pre-process circuit 34 may provide the post frequency-divided RHR oscillation signal RHROscD as the intermediate frequency-divided RHR oscillation signal RhrOsc2 to the sampler 38. Based on the intermediate frequency-divided RHR oscillation signal RhrOsc2, the sampler circuit 38 may provide one or more pulses on the ArmSample signal, responsive to the RHR signal while the matchF signal is in the active state. The sampling circuit (e.g., 16, 16') may provide the sampling signal (Sample) based on the ArmSample signal, further responsive to the PrePulse signal, thus there may be a case that the sampling circuit may wait for providing the sampling signal based on the a first pulse of ArmSample signal after receiving the row address X0 until a receipt of next PrePulse signal.

Figure 6C:
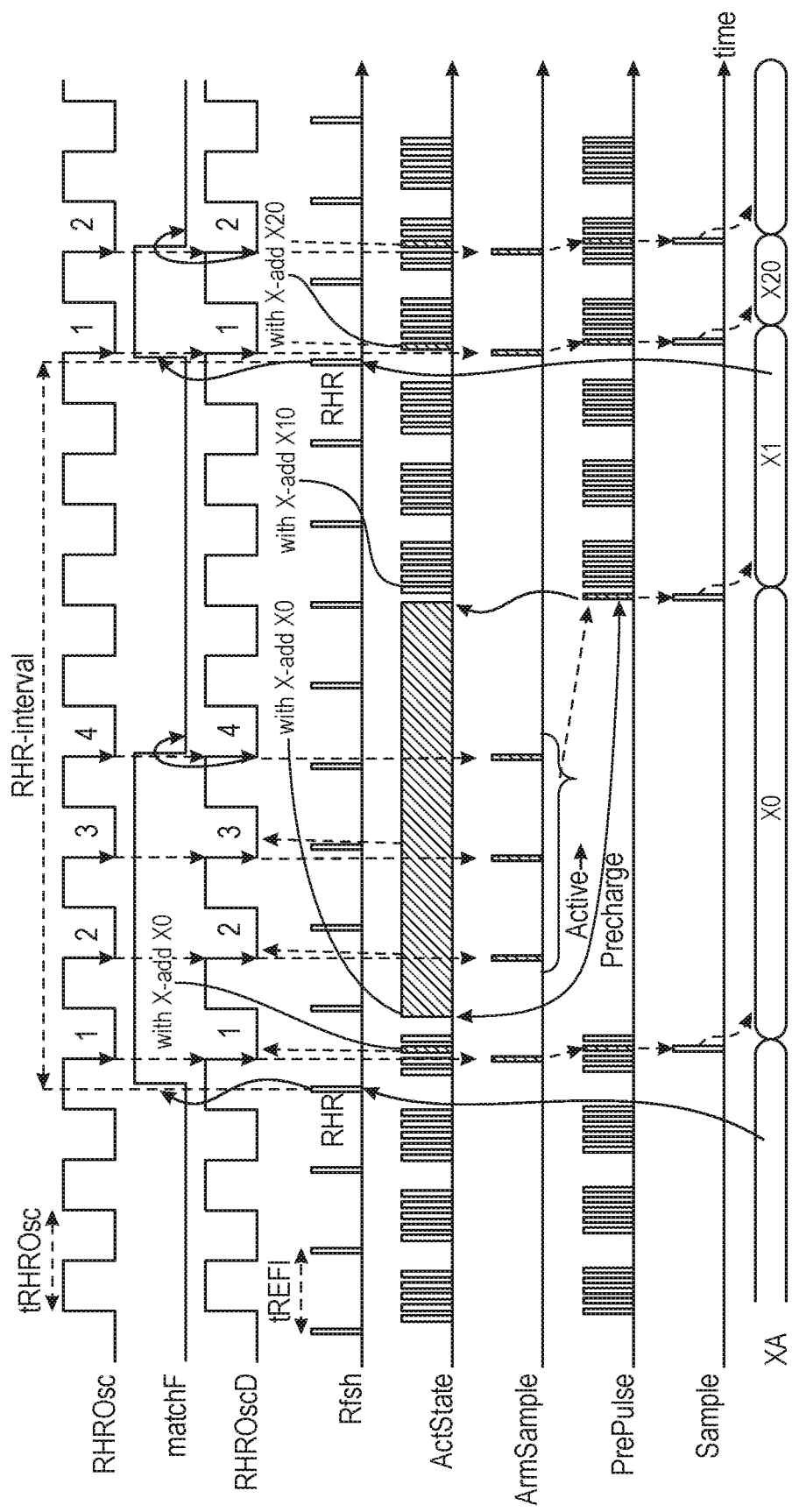
FIG. 6C is a timing diagram of signals in the sampling timing generator circuit of FIG. 3 receiving an active command with a long standby in accordance with an embodiment of the present disclosure.
Figure 6D:
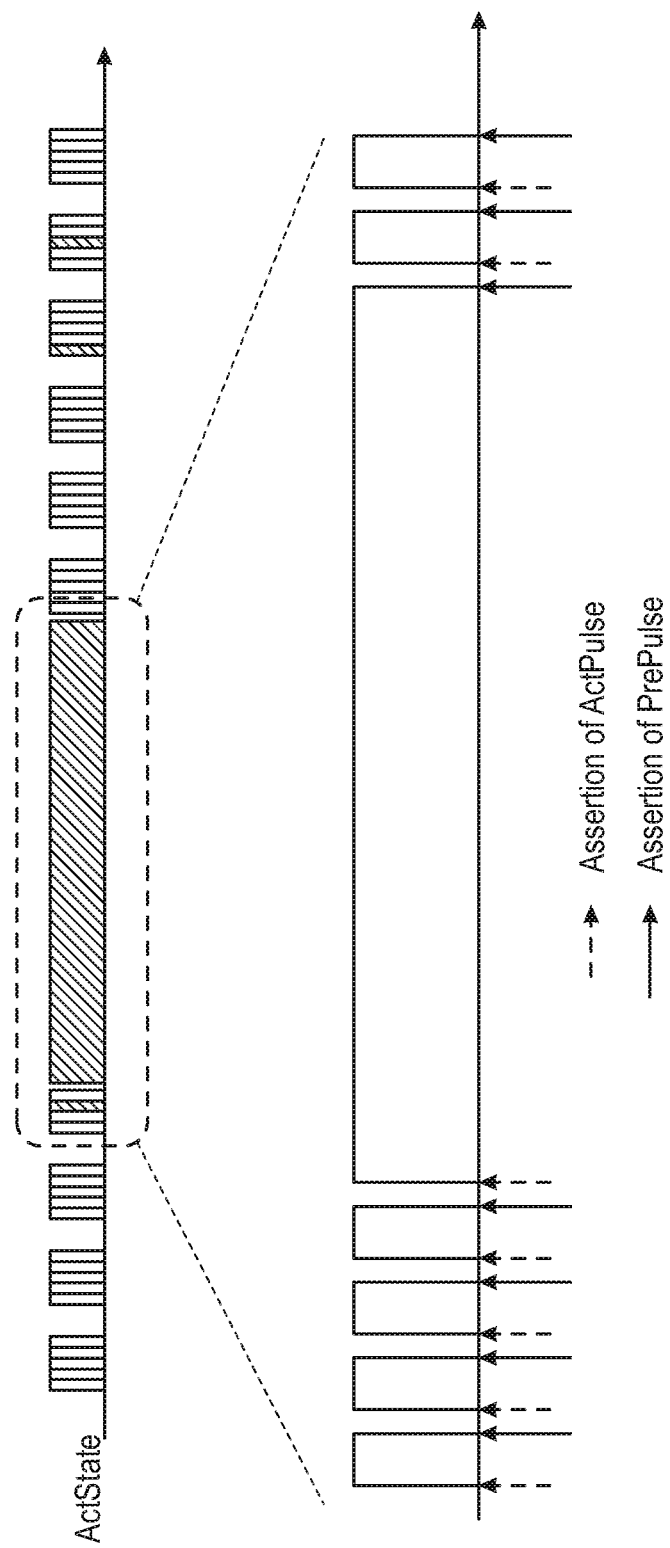
FIG. 6D is a magnified timing diagram of a portion of the timing diagram of FIG. 6C in accordance with the embodiment of the present disclosure.

FIG. 6C is a timing diagram of signals in the sampling timing generator circuit of FIG. 3 receiving an active command with a long standby in accordance with an embodiment of the present disclosure, FIG. 6D is a magnified timing diagram of a portion of the timing diagram of FIG. 6C in accordance with the embodiment of the present disclosure. Unlike receiving the continuous active commands, the ActState signal may stay active (e.g., a logic high level) due to absence of a precharge command for several cycles of the frequency-divided RHR oscillation signal RHROsc after receiving a recent active (ACT) command and an updated row addresses X0. While the matchF signal is active, the logic circuit 35 may provide an inversion of the post frequency-divided RHR oscillation signal RHROscD as the intermediate frequency-divided RHR oscillation signal RhrOsc2 to the sampler 38. Based on the intermediate frequency-divided RHR oscillation signal RhrOsc2, the sampler circuit 38 may provide pulses on the ArmSample signal while the matchF signal is active. Based on the pulses on the ArmSample signal, the sampling circuit (e.g., 16, 16') may provide the sampling signal (Sample) responsive to the PrePulse signal. While the standby in the active state, there is no precharge command to be received for several cycles, and the PrePulse signal stays inactive, as shown in FIG. 6D, that keeps the ActState signal in the active state (e.g., a logic high level sustained). Thus, the sampling circuit may wait providing a pulse on the sampling signal (Sample) until receiving the PrePulse signal in an active state, regardless of one or more pulses on the ArmSample signal.

Figure 7A:
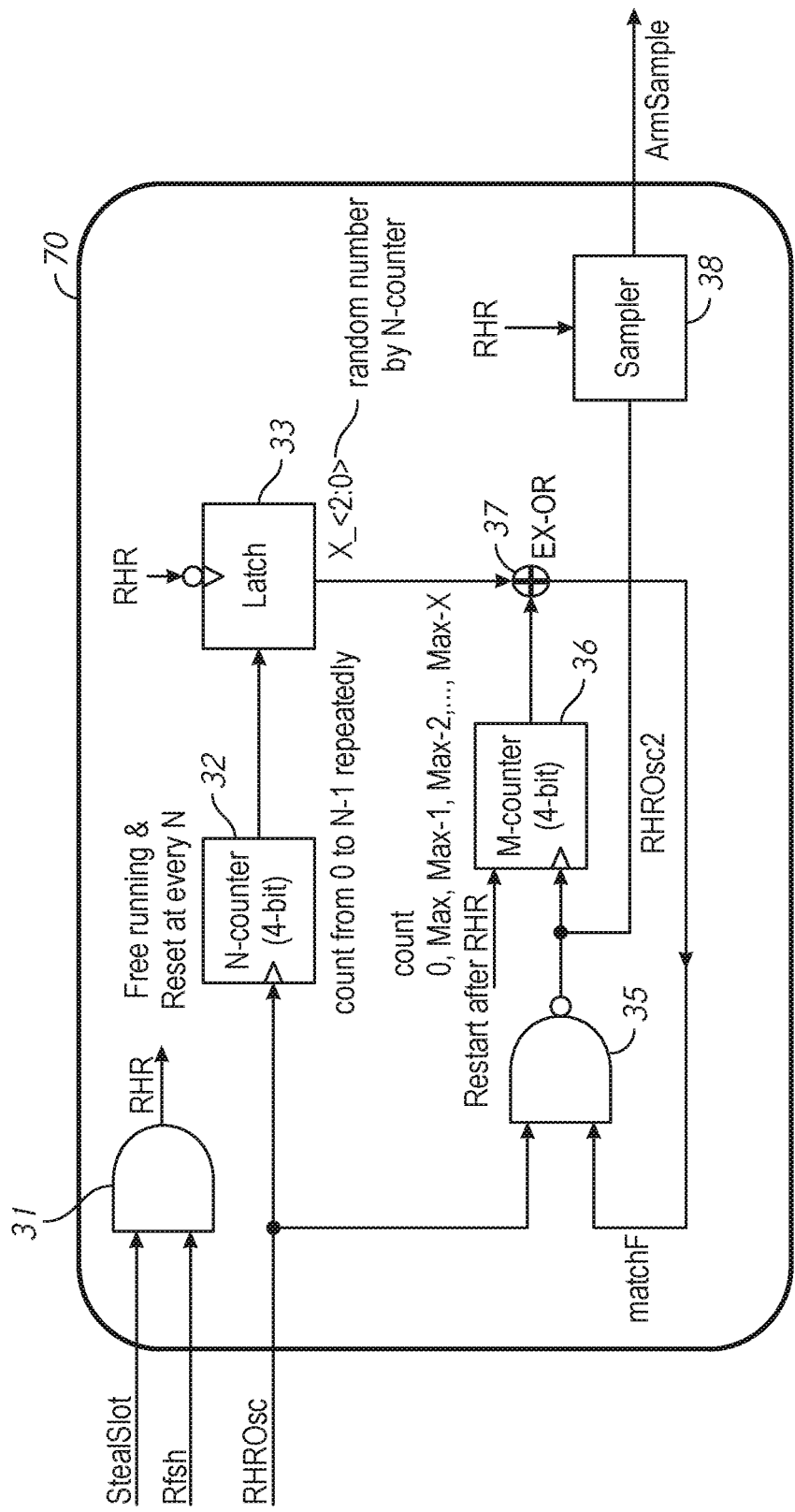
FIG. 7A is a circuit diagram of a conventional sampling timing generator circuit.
Figure 7B:
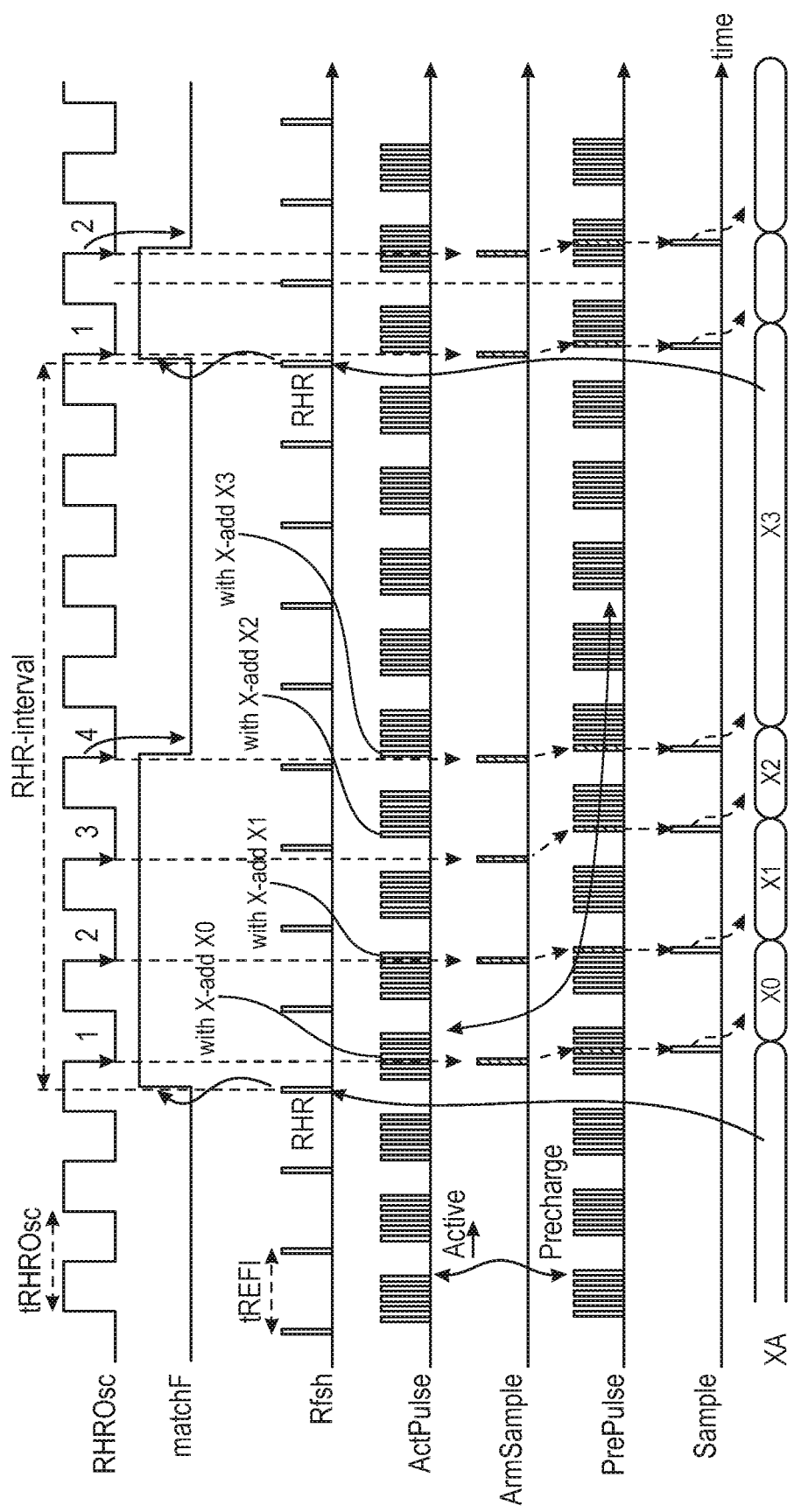
FIG. 7B is a timing diagram of signals in the conventional sampling timing generator circuit of FIG. 7A receiving continuous active commands.
Figure 7C:
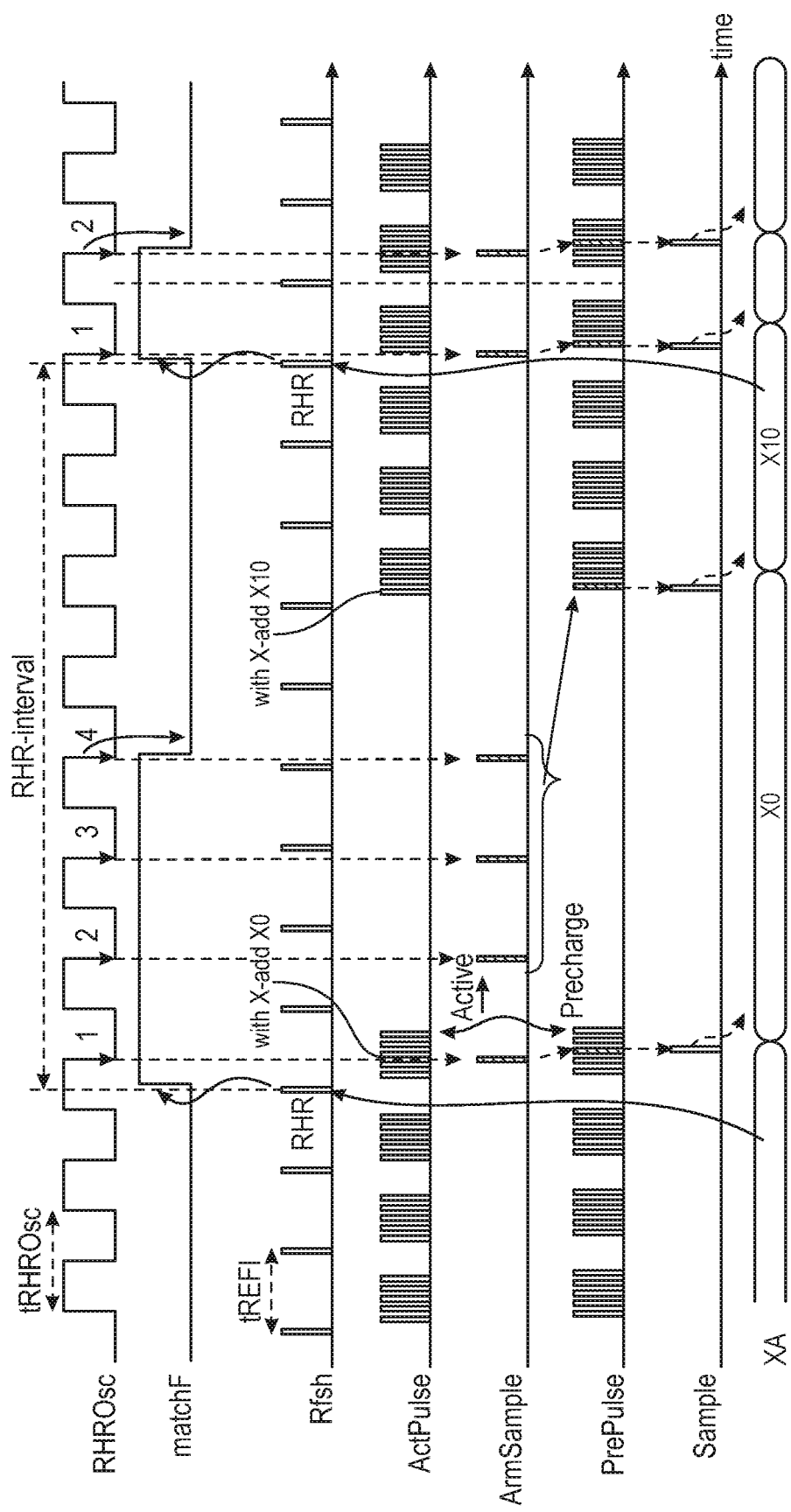
FIG. 7C is a timing diagram of signals in the conventional sampling timing generator circuit of FIG. 7A receiving a precharge command with a long standby.
Figure 7D:
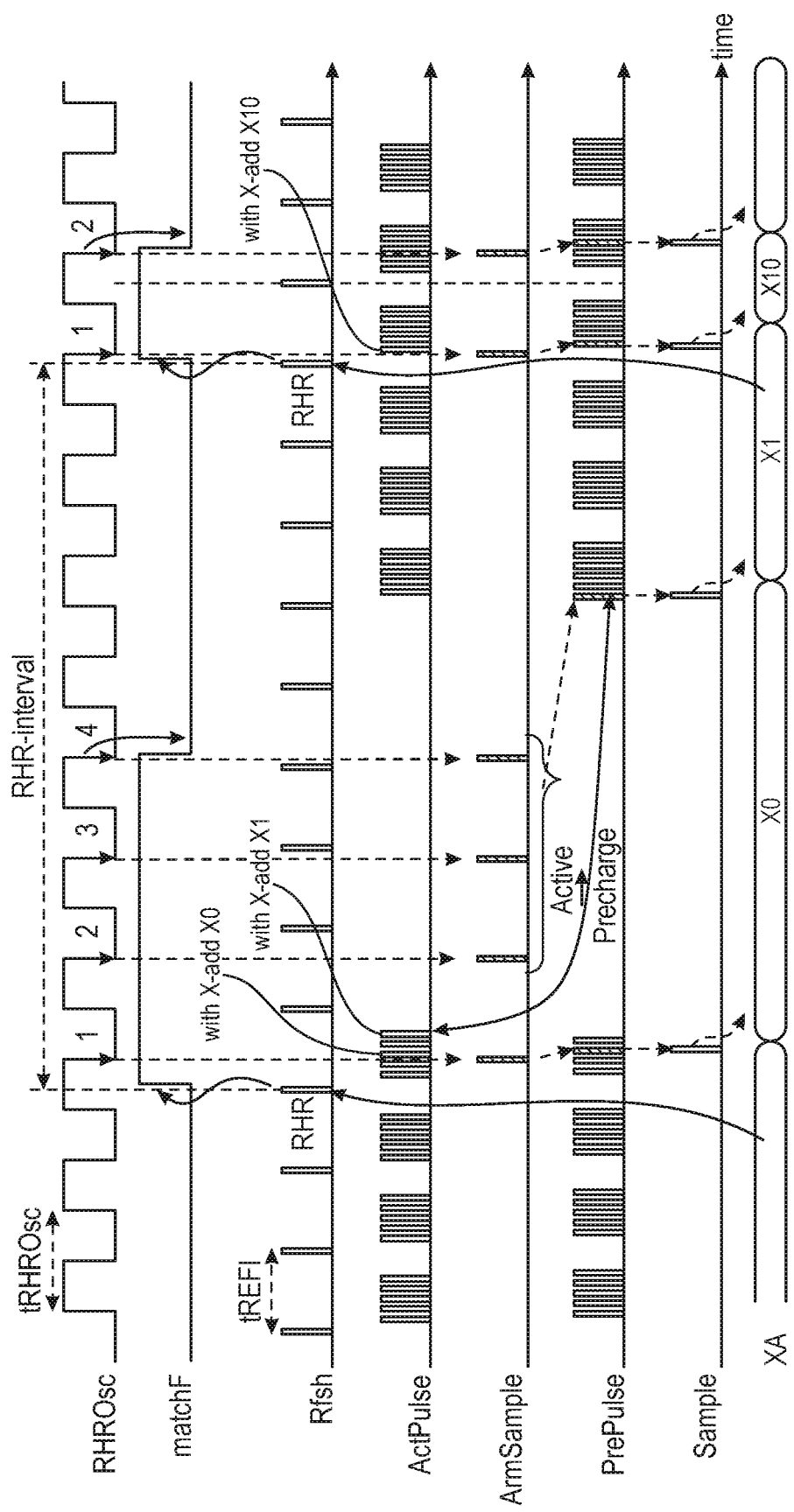
FIG. 7D is a timing diagram of signals in the conventional sampling timing generator circuit of FIG. 7A receiving an active command with a long standby.

FIG. 7A is a circuit diagram of a conventional sampling timing generator circuit 70. Unlike the sampling timing generator circuit 30, no oscillator signal pre-process circuit 34, which processes the ActState signal in order to control the intermediate frequency-divided RHR oscillation signal (RHROsc2) for the M-counter 36, is included in the conventional sampling timing generator circuit 70. FIG. 7B is a timing diagram of signals in the conventional sampling timing generator circuit 70 of FIG. 7A receiving continuous active. For continuous receptions of the active commands, there is no difference between the ArmSample signal of the conventional sampling timing generator circuit 70 and the Sample signal in FIG. 7B and the ArmSample signal of the sampling timing generator circuit 30 and the Sample signal in FIG. 3. FIG. 7C is a tuning diagram of signals commands in the conventional sampling timing generator circuit 70 of FIG. 7A receiving a precharge command with a long standby. In absence of the oscillator signal pre-process circuit 34 for processing the ActState signal, pulses may be provided on the ArmSample signal regardless of the long standby after the precharge command that may not be used by the sampling circuit (e.g., 16, 16') in absence of the precharge command. FIG. 7D is a timing diagram of signals in the conventional sampling timing generator circuit 70 of FIG. 7A receiving an active command with a long standby. Regardless of the structural difference between the conventional sampling timing generator circuit 70 and the sampling timing generator circuit 30, there is no difference in functionality of detecting Ras-Clobber error during the long standby after the active command because the ArmSample signal is independent from commands (e.g., the active command, the precharge command).

Figure 8A:
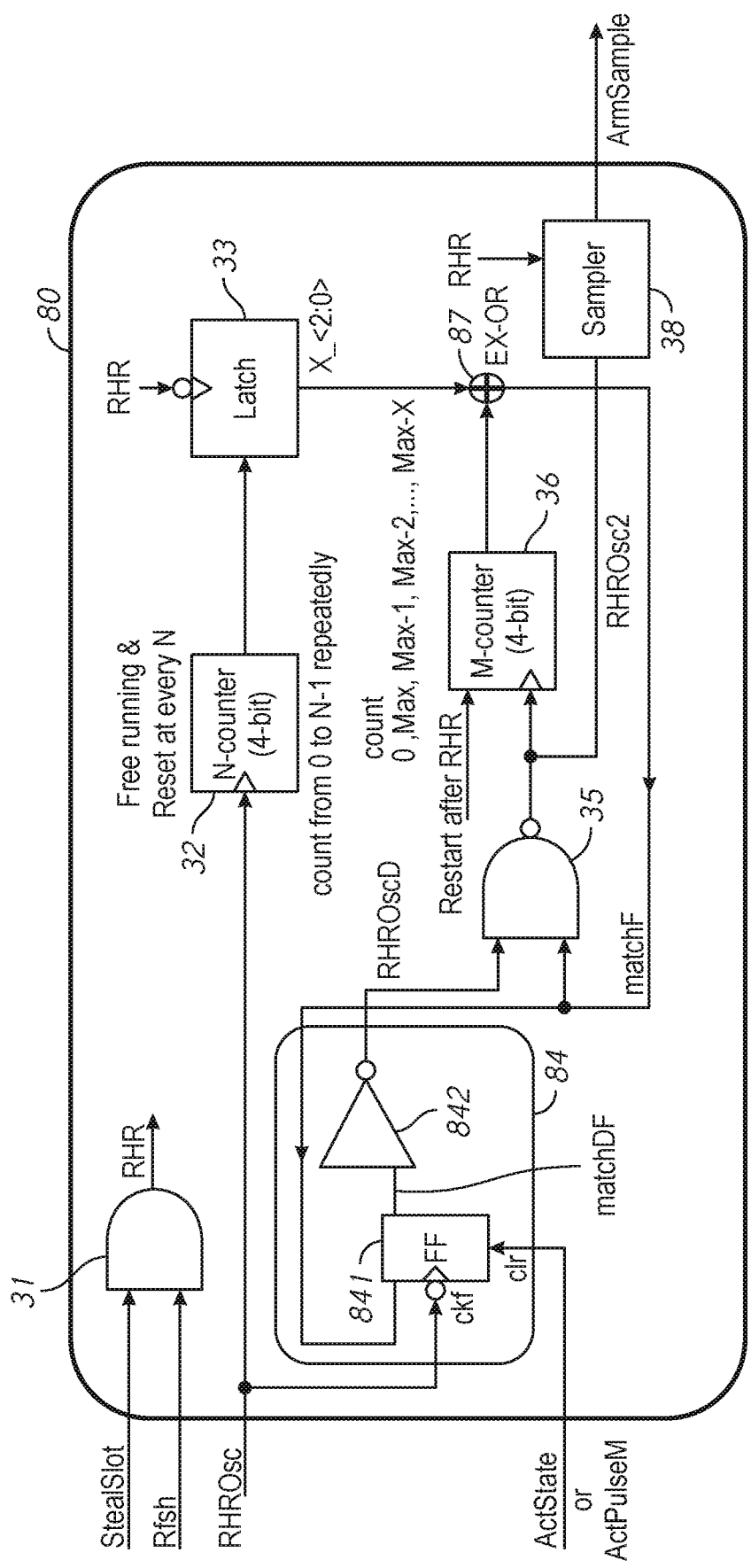
FIG. 8A is a circuit diagram of a conventional sampling timing generator circuit.
Figure 8B:
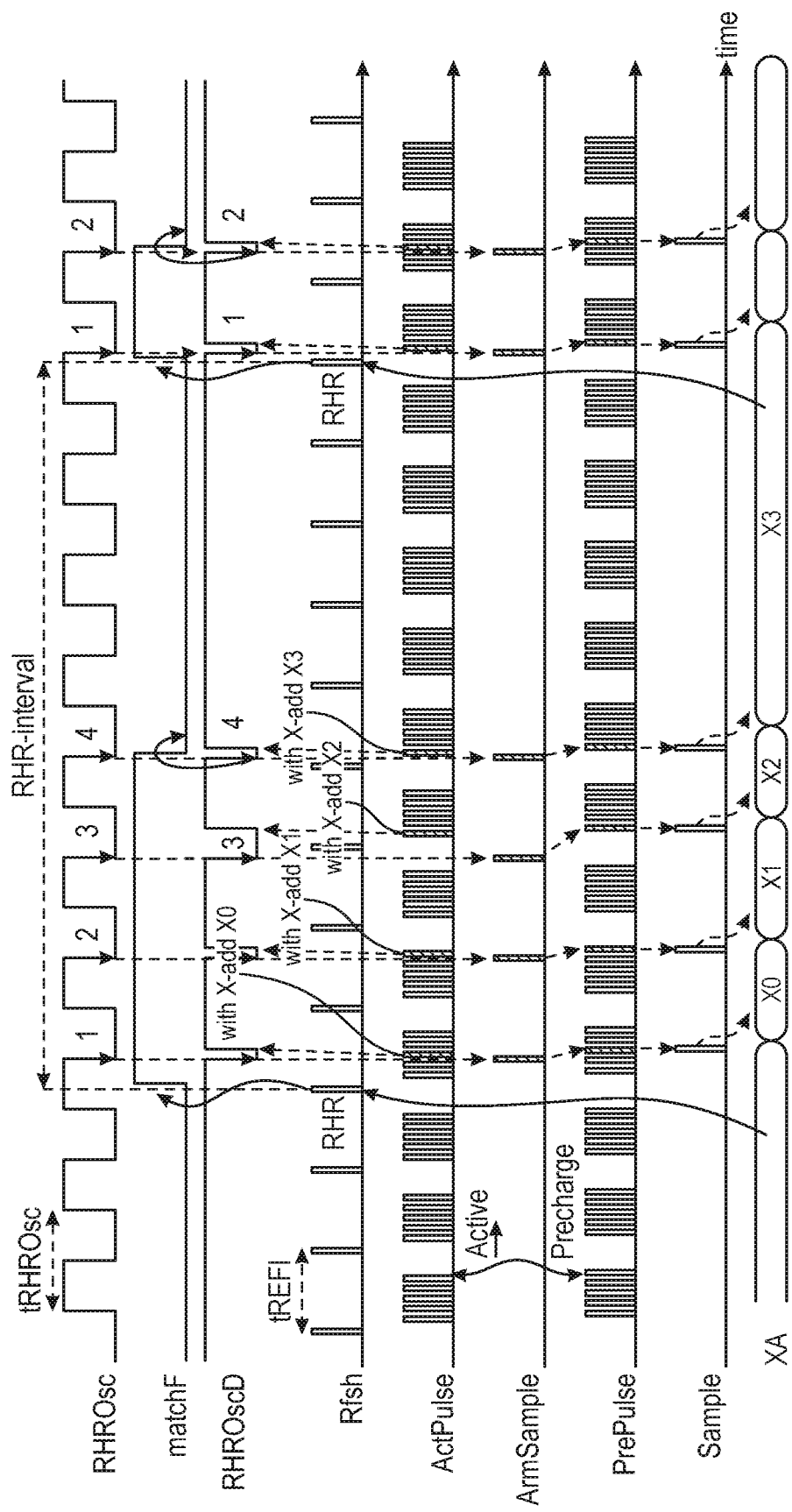
FIG. 8B is a timing diagram of signals in the sampling timing generator circuit of FIG. 8A receiving continuous active commands.
Figure 8C:
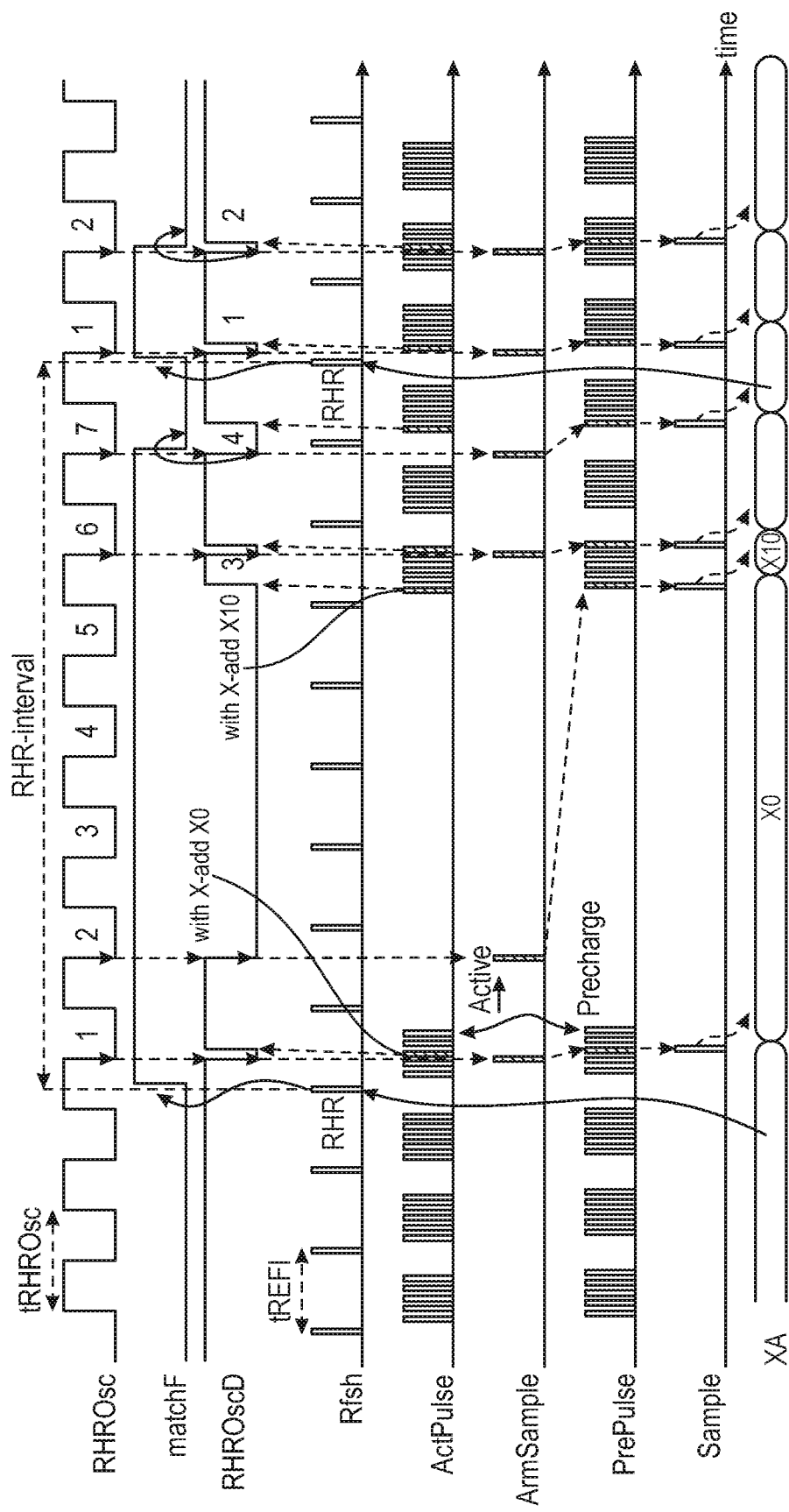
FIG. 8C is a timing diagram of signals in the conventional sampling timing generator circuit of FIG. 8A receiving a precharge command with a long standby.
Figure 8D:
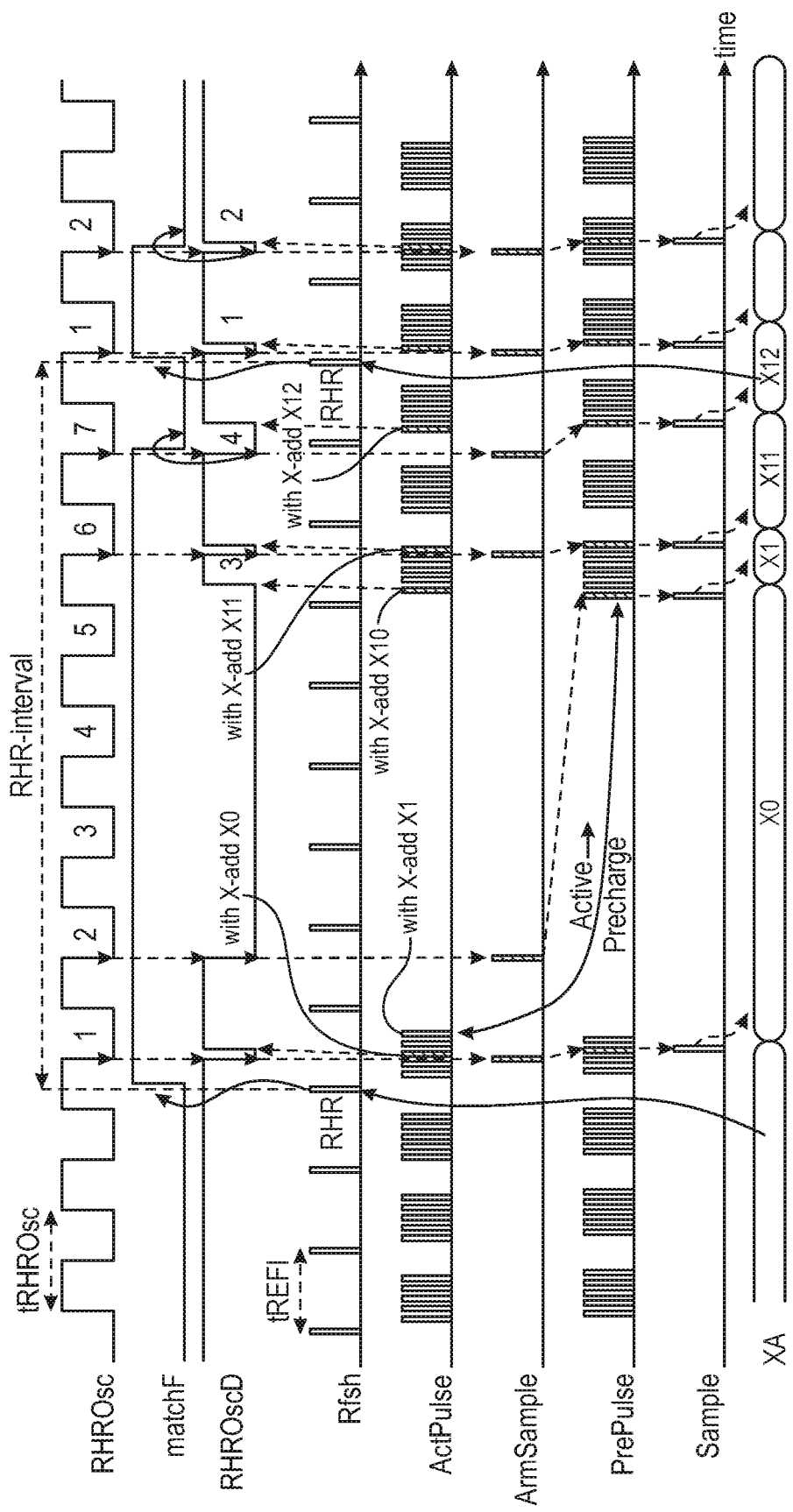
FIG. 8D is a timing diagram of signals in the conventional sampling timing generator circuit of FIG. 8A receiving an active command with a long standby.

FIG. 8A is a circuit diagram of a conventional sampling timing generator circuit 80. For example, the conventional sampling timing generator circuit 80 may include an oscillator signal pre-process circuit 84 that may include an inverter 842 instead of the logic circuit 342 that may be an AND circuit. FIG. 8B is a timing diagram of signals in the sampling timing generator circuit of FIG. 8A receiving continuous active commands. FIG. 8C is a timing diagram of signals in the conventional sampling timing generator circuit of FIG. 8A receiving a precharge command with a long standby. For continuous receptions of the active commands as shown in FIG. 8B and the precharge command with the long standby as shown in FIG. 8C, there is no difference between the Arm Sample signal of the conventional sampling timing generator circuit 80 and the Sample signal in FIG. 8A and the ArmSample signal of the sampling timing generator circuit 30 and the Sample signal in FIG. 3. FIG. 8D is a timing diagram of signals in the conventional sampling timing generator circuit of FIG. 8A receiving an active command with a long standby. During the long standby after the active command, a latch (e.g., Flip-Flop) 841 may receive the ActState signal or the ActPulse(M) signal that has been at one level (constantly active or constantly inactive after one pulse). Accordingly, the latch 841 may provide one level signal as the post frequency-divided RHR oscillation signal RHROscD during the long standby instead of a clock-wise signal reflecting the frequency-divided RHR oscillation signal RHROsc, responsive to the ActState signal or the ActPulse(M) signal, Thus, the logic circuit 35 may provide the intermediate frequency-divided RHR oscillation signal (RHROsc2) reflecting the one level during the long standby and the sampler circuit 38 may not provide any pulses on the ArmSample signal, as shown in FIG. 8D.

Figure 9A:
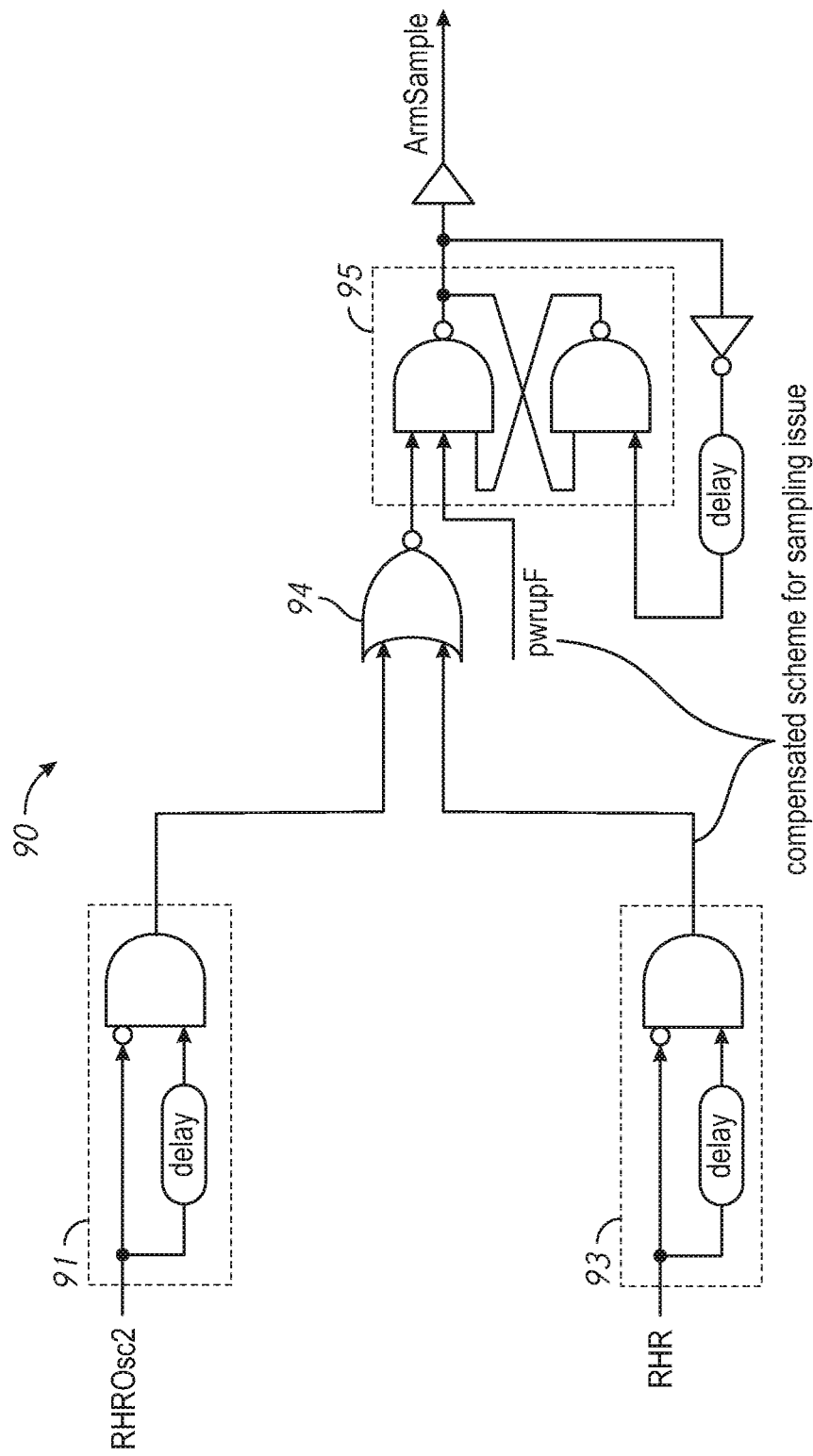
FIG. 9A is a circuit diagram of a sampler circuit in accordance with an embodiment of the present disclosure.

FIG. 9A is a circuit diagram of a sampler circuit 90 in accordance with an embodiment of the present disclosure. For example, the sampler circuit 90 may be used as the sampling timing generator circuit 38 in FIG. 3. The sampler circuit 90 may receive the intermediate frequency-divided RHR oscillation signal (RHROsc2) and the RHR signal. The sampler circuit 90 may include an RHROsc2 pulse circuit 91 and an RHR pulse circuit 93. The RhrOsc2 pulse circuit 91 may provide a pulse signal with a pulse width corresponding to a delay circuit in the RhrOsc2 pulse circuit 91 at an end (e.g., a falling edge) of an active period of the intermediate frequency-divided RHR oscillation signal (RhrOsc2). The RHR pulse circuit 93 may provide a pulse signal with a pulse width corresponding to a delay circuit in the RHR pulse circuit 93 at an end (e.g., a falling edge) of an active period of the RHR signal. The sampler circuit 90 may include a logic circuit 94 that may receive the output signals from the RHROsc2 pulse circuit 91 and the RHR pulse circuit 93. If either one of these output signals is active, then the logic circuit 94 may provide an active low signal (e.g., at a logic low level for being active) to a latch circuit 95. For example, the latch circuit 95 may be a flip-flop circuit or a set-reset latch, may be set by either the output signal of the active low signal from the logic circuit 94 or an inversion of a power-up signal (pwrupF). The latch circuit 95 may provide the trigger signal for sampling (ArmSample) to a sampling circuit (e.g., the sampling circuit 16 in FIG. 1A). The trigger signal for sampling (ArmSample) with an inversion and a delay may also be provided to the latch circuit 95 to reset the latch circuit 95.

Figure 9B:
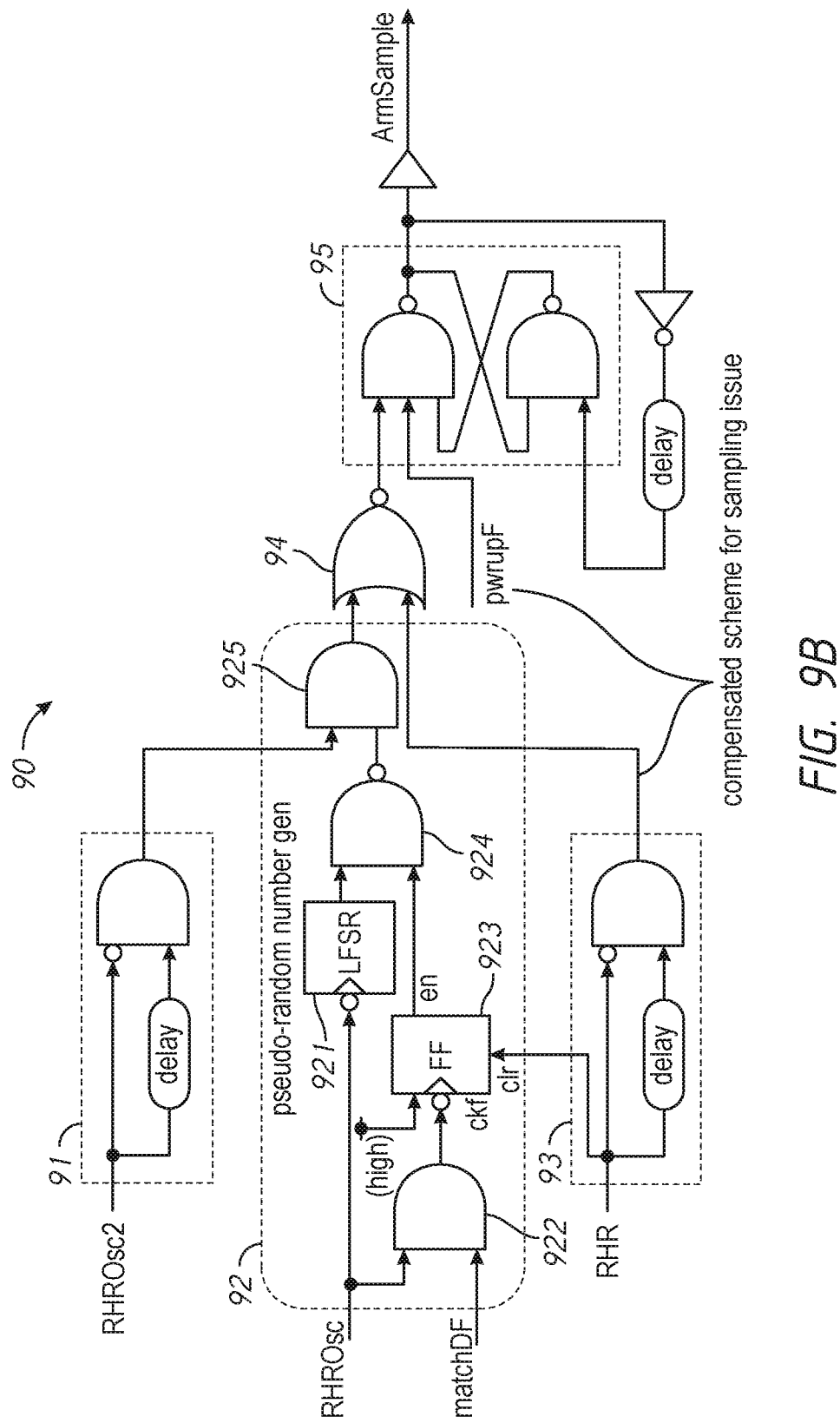
FIG. 9B is a circuit diagram of a sampler circuit in accordance with an embodiment of the present disclosure.

FIG. 9B is a circuit diagram of a sampler circuit 90' in accordance with an embodiment of the present disclosure. For example, the sampler circuit 90' may be used as the sampling timing generator circuit 38 in FIG. 3. In addition to the sampler circuit 90, the sampler circuit 90' may further include a filter circuit 92. The filter circuit 92 may include a pseudo-random number generator 921 that may randomly provide the frequency-divided RHR oscillation signal (RHROsc). Thus, the pseudo-random number generator 921 may function as a random filter of the frequency-divided RHR oscillation signal (RHROsc). For example, the pseudo-random number generator 921 may be a linear-feedback shift register (LFSR). The filter circuit 92 may include a first AND circuit 922. The first AND circuit 922 may receive the matchDF signal and the frequency-divided RHR oscillation signal (RHROsc) and may provide the frequency-divided RHR oscillation signal (RHROsc) as an output signal while the matchDF signal in an active state (e.g., a logic high level) that is responsive to the precharge command with the long standby. A latch circuit (e.g., a flip-flop) 923 may receive the output signal from the first AND circuit 922 and provide an enable signal (en) responsive to the RHR signal. Thus, a NAND circuit 924 in the filter circuit 92 that may receive the enable signal from the latch circuit 923 and the randomly provided frequency-divided RHR oscillation signal (RHROsc) from the pseudo-random number generator 921, and may provide an output signal reflecting the frequency-divided RHR oscillation signal (RHROsc) with randomization during the long standby. A second AND circuit 925 in the filter circuit 92 may receive the output signal of RHROsc2 pulse circuit 91 and the output signal from the NAND circuit 924 and may further provide an intermediate filter signal to the latch circuit 95.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a memory array;
   a sampling timing generator circuit co red to provide a timing signal of sampling a row address; and
   a latch circuit configured to latch an access address of the memory array for refresh operation, responsive to at least in part on a pulse on the timing signal,
   wherein the sampling timing generator circuit is configured to provide pulses of the timing signal at random responsive to the memory array being accessed and to stop providing pulses of the timing signal at random responsive to standby state.

2. The apparatus of claim 1, wherein the sampling timing generator circuit comprises a sampler configured to provide the pulses of the timing signal by sampling a first oscillation signal responsive to a row hammer refresh signal.

3. The apparatus of claim 2, wherein the sampling timing generator circuit further comprises an oscillator signal pre-process circuit coupled to the sampler, and configured to provide the first oscillation signal to the sampler responsive, at least in part, to a second oscillation signal and a command state signal.

4. The apparatus of claim 3, wherein the sampling timing generator circuit further comprises an enable circuit coupled between the oscillator signal pre-process circuit and the sampler, and configured to enable/disable providing the first oscillation signal to the sampler responsive to a match signal.

5. The apparatus of claim 4, Wherein the enable circuit is configured to:
   enable providing the first oscillation signal to the sampler responsive, at least in part, to an active command state signal; and
   disable providing the first oscillation signal to the sampler responsive, at least in part, to an inactive command state signal.

6. The apparatus of claim 5, wherein the active command state signal is provided responsive, at least in part, to an active command with standby, and wherein the inactive command state signal is provided responsive, at least in part, to a precharge command with standby.

7. The apparatus of claim 1, wherein the sampling timing generator circuit comprises:
   a first enable circuit configured to provide an enable signal responsive, at least in part, to a respective pulse of the pulses of the timing signal; and
   a second enable circuit coupled to the first enable circuit, and configured to provide the timing signal responsive, at least in part, to the enable signal and a pulse signal provided upon a receipt of a precharge command.

8. A method, comprising:
accessing, at an access control circuit, a memory array responsive to each active command of a plurality of active commands;
stopping access of the memory array responsive to each precharge command of a plurality of precharge commands associated with the plurality of active commands;
providing a plurality of sampling pulses at random responsive, at least in part, to an oscillation signal and an active level of an act-state signal; and
sampling at least one access address of the plurality of active commands responsive to at least one sampling pulse of the plurality of sampling pulses and at least one precharge command of the plurality of precharge commands,
wherein the act-state signal is configured to be set to the active level while the access control circuit is accessing the memory array and is indicative of a standby state of the memory array based on a precharge command or standby command.

9. The method of claim 8, wherein providing the plurality of sampling pulses comprises sampling the oscillation signal responsive to a row hammer refresh signal.

10. The method of cairn 9, wherein providing the plurality of sampling pulses further comprises providing the oscillation signal responsive, at least in part, to another oscillation signal and a command state signal.

11. The method of claim 8 further comprising stopping providing the plurality of sample pulses by not providing the oscillation signal responsive, at least in part, to a matching signal and an inactive command state signal.

12. The method of claim 11 further comprising providing the inactive command state signal responsive, at least in part, to a precharge command with standby.

13. The method of claim 8, wherein sampling the at least one access address of the plurality of active commands comprises:
providing a sampling signal responsive to at least one sampling pulse of the plurality of sampling pulses and the at least one precharge command of the plurality of precharge commands;
latching the at least one access address responsive to the sampling signal; and
determining an adjacent address of the latched access address.

14. The method of claim 13, wherein providing the sampling signal comprises:
clocking a flip-flop with the at least one sampling pulse of e plurality of sampling pulses to provide an enable signal; and
providing the sampling signal responsive to an active level of the enable signal.

15. An apparatus comprising:
a plurality of memory banks each including:
  a memory array;
  a sampling circuit configured to receive pulses of timing signals and provide an active sampling signal responsive to a respective pulse of the pulses of timing signals and a pulse signal provided based on a precharge command; and
  a switch configured to provide a row address of the memory array or an adjacent address of the row address for performing a row hammer operation of the memory array; and
at least one sampling timing generator circuit configured to:
  provide the pulses of timing signals responsive, at least in part, to an active command with standby; and
  not provide the pulses of timing signals responsive, at least in part, to a precharge command with standby.

16. The apparatus of claim 15, wherein a memory bank of the plurality of memory banks further comprises a latch and calculator coupled to the sampling circuit and configured to receive the sampling signal, and responsive to the active sampling signal latch the row address of the memory array and determine the adjacent address of the row address.

17. The apparatus of claim 16, wherein the at least one sampling timing generator circuit comprises a sampler configured to provide the pulses of timing signals by sampling a first oscillation signal responsive to a row hammer refresh signal.

18. The apparatus of claim 17, wherein the at least one sampling timing generator circuit further comprises an oscillator signal pre-process circuit coupled to the sampler and configured to:
provide the first oscillation signal to the sampler responsive, at least in part, to the active command with standby; and
not provide the first oscillation signal responsive, at least in part, to the precharge command with standby.

19. The apparatus of claim 18, wherein the oscillator signal pre-process circuit comprises:
a logic circuit configured to provide the first oscillation signal responsive to a second oscillation signal and an enable signal; and
a flip-flop coupled to the logic circuit, the flip-flop is clocked by the second oscillation signal and configured to provide the enable signal responsive, at least in part, to an active command state signal.

20. An apparatus comprising:
a plurality of memory banks each including:
a memory array; and
a switch configured to provide a row address of the memory array or an adjacent address of the row address for performing a row hammer operation of the memory array;
at least one sampling timing generator circuit configured to:
provide pulses of timing signals responsive, at least in part, to an active command with standby; and
not provide the pulses of timing signals responsive, at least in part, to a precharge command with standby; and
additional sampling timing generator circuits, each configured to:
provide respective pulses of timing signals responsive, at least in part, to a respective active command with standby; and
not provide the respective pulses of timing signals responsive, at least in part, to a respective precharge command with standby;
Wherein the at least one sampling timing generator circuit and the additional sampling timing generator circuits are respectively coupled to a corresponding memory bank of the plurality of memory banks.

* * * * *